US012666942B2

(12) United States Patent
Huang et al.

(10) Patent No.: US 12,666,942 B2
(45) Date of Patent: Jun. 23, 2026

(54) SEMICONDUCTOR DEVICES WITH ACTIVE REGIONS AND CONDUCTIVE REGIONS OF TWO WIDTHS AND METHODS OF DESIGNING AND MANUFACTURING THE SAME

(71) Applicant: Taiwan Semiconductor Manufacturing Company, Ltd., Hsinchu (TW)

(72) Inventors: Ching-Yu Huang, Hsinchu City (TW); Shih-Wei Peng, Hsinchu City (TW); Wei-Cheng Tzeng, Taipei (TW); Wei-Cheng Lin, Taichung City (TW); Jiann-Tyng Tzeng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 811 days.

(21) Appl. No.: 17/657,631

(22) Filed: Apr. 1, 2022

(65) Prior Publication Data
US 2023/0016635 A1      Jan. 19, 2023

Related U.S. Application Data

(60) Provisional application No. 63/220,320, filed on Jul. 9, 2021.

(51) Int. Cl.
*H10W 20/42*          (2026.01)
*H03K 3/356*          (2006.01)
(Continued)

(52) U.S. Cl.
CPC ............ *H10W 20/42* (2026.01); *H03K 3/356* (2013.01); *H10D 84/0149* (2025.01);
(Continued)

(58) Field of Classification Search
CPC ........... H01L 23/5226; H10D 84/0149; H10D 84/83; H10D 84/038; H10D 84/0151; H03K 3/356; H10W 20/42
(Continued)

(56) References Cited

U.S. PATENT DOCUMENTS 7,504,731 B2 *   3/2009   Wang ................... H01L 23/5226
                                                        257/E23.145
8,933,520 B1 *   1/2015   Jergovic ................ H01L 23/522
                                                        257/369
(Continued)

FOREIGN PATENT DOCUMENTS

TW          200618191 A          6/2006
TW          202105738 A          2/2021
TW          202123417 A          6/2021

*Primary Examiner* — Jami Valentine Miller
(74) *Attorney, Agent, or Firm* — Finnegan, Henderson, Farabow, Garrett & Dunner, L.L.P.

(57)          ABSTRACT

A semiconductor device includes first, second, and third conductive regions and first and second active regions. The first conductive region has a first width and extends along a first direction. The second conductive region has a second width and extends along the first direction. The first width is greater than the second width. The first active region has a third width and extends along the first direction. The second active region has a fourth width and extends along the first direction. The third width is less than the fourth width. The third conductive region extends along a second direction and is electrically connected to the first conductive region. The second direction is different from the first direction. The first and second active regions are neighboring active regions.

20 Claims, 22 Drawing Sheets

(51) Int. Cl.
| | |
|---|---|
| *H10D 84/01* | (2025.01) |
| *H10D 84/03* | (2025.01) |
| *H10D 84/83* | (2025.01) |

(52) U.S. Cl.
CPC ....... *H10D 84/0151* (2025.01); *H10D 84/038* (2025.01); *H10D 84/83* (2025.01)

(58) Field of Classification Search
USPC .......................................................... 257/506
See application file for complete search history.

(56) References Cited

U.S. PATENT DOCUMENTS

| | | | |
|---|---|---|---|
| 9,627,316 B1 * | 4/2017 | Chang ................. | H10D 64/511 |
| 2003/0143790 A1 * | 7/2003 | Wu ........................ | H10B 69/00 |
| | | | 257/E27.103 |
| 2005/0141265 A1 * | 6/2005 | Yokoyama ............ | H10B 10/00 |
| | | | 257/E27.098 |
| 2016/0133307 A1 * | 5/2016 | Lee ........................ | H10N 50/85 |
| | | | 257/421 |
| 2017/0103948 A1 * | 4/2017 | Lee .................... | H10D 30/6219 |
| 2017/0200723 A1 * | 7/2017 | Lee ........................ | H10B 43/27 |
| 2017/0373246 A1 * | 12/2017 | Wang .................... | H10N 50/10 |
| 2019/0378794 A1 * | 12/2019 | Sharma ................... | G05F 3/20 |
| 2021/0126128 A1 | 4/2021 | Kim et al. | |
| 2021/0202505 A1 | 7/2021 | Chang et al. | |
| 2023/0117646 A1 * | 4/2023 | Lee ........................ | H10N 50/10 |
| | | | 257/121 |
| 2023/0154846 A1 * | 5/2023 | Chiu .................... | H01L 23/528 |
| | | | 257/758 |

* cited by examiner

Double-Height Cell

CMD

VD

VD2

AR

MD

400C 413-1

411b-2

413-2

412

414

411b-1

Single-Height Cell

Y

X

CMD

VD

VD2

AR

MD

500A 111b-2

113

112

114

111b-1

511b-2

513

512

514

511b-1

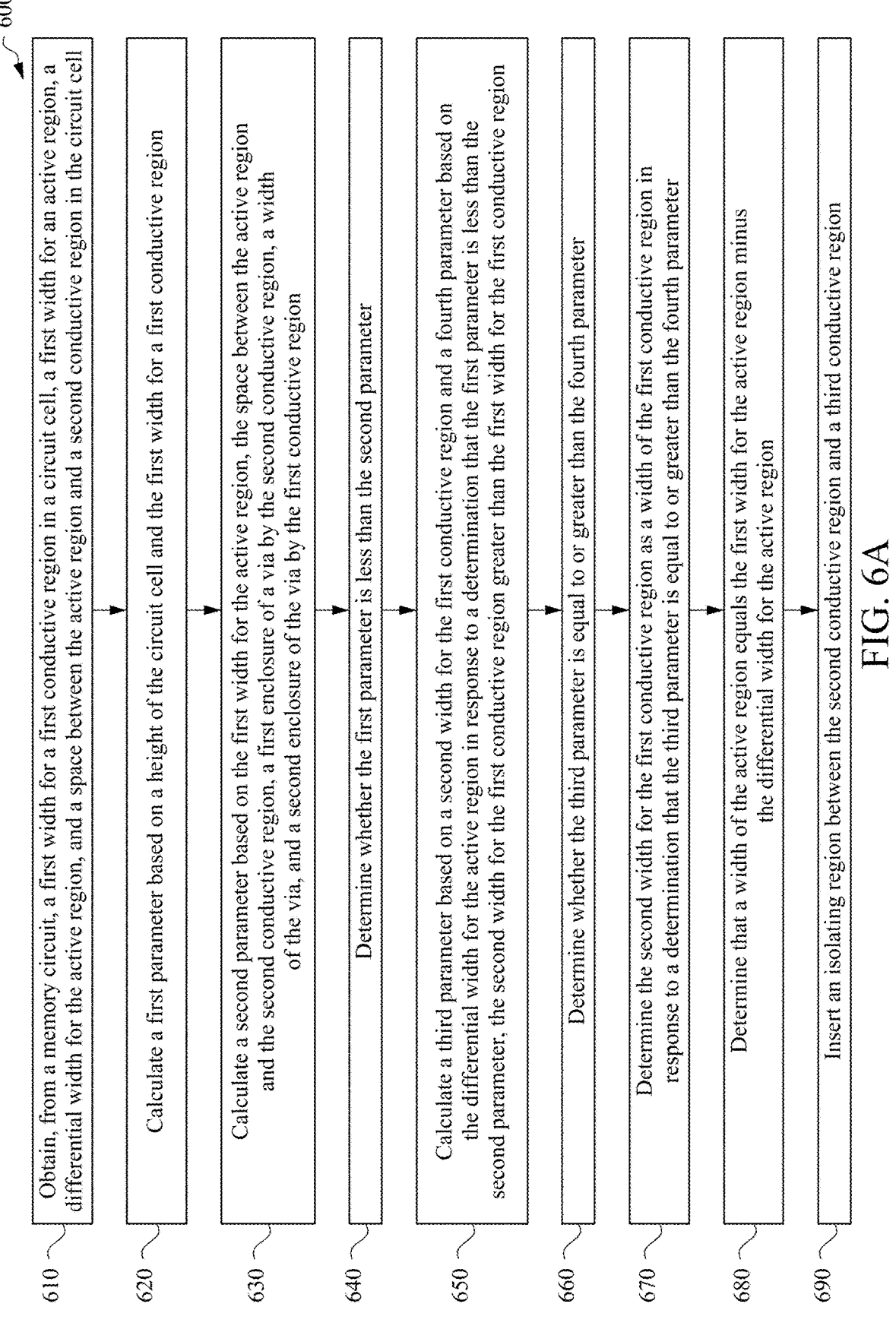

610 Obtain, from a memory circuit, a first conductive region in a circuit cell, a first width for a first conductive region in a circuit cell, a first width for an active region, a differential width for the active region, and a space between the active region and a second conductive region in the circuit cell 620 Calculate a first parameter based on a height of the circuit cell and the first width for a first conductive region 630 Calculate a second parameter based on the first width for the active region, the space between the active region and the second conductive region, a first enclosure of a via by the second conductive region, a width of the via, and a second enclosure of the via by the first conductive region 640 Determine whether the first parameter is less than the second parameter 650 Calculate a third parameter based on a second width for the first conductive region and a fourth parameter based on the differential width for the active region in response to a determination that the first parameter is less than the second parameter, the second width for the first conductive region greater than the first width for the first conductive region 660 Determine whether the third parameter is equal to or greater than the fourth parameter 670 Determine the second width for the first conductive region as a width of the first conductive region in response to a determination that the third parameter is equal to or greater than the fourth parameter 680 Determine that a width of the active region equals the first width for the active region minus the differential width for the active region 690 Insert an isolating region between the second conductive region and a third conductive region

700A

Wide M0 Width

M0 Space

M0 Width

M0

Wide M0

Power Rail

VD

Enclosure VD/M0

Power Rail (V$_{SS}$)

Normal M0

Wide M0

Normal M0

Power Rail (V$_{DD}$)

X

Y

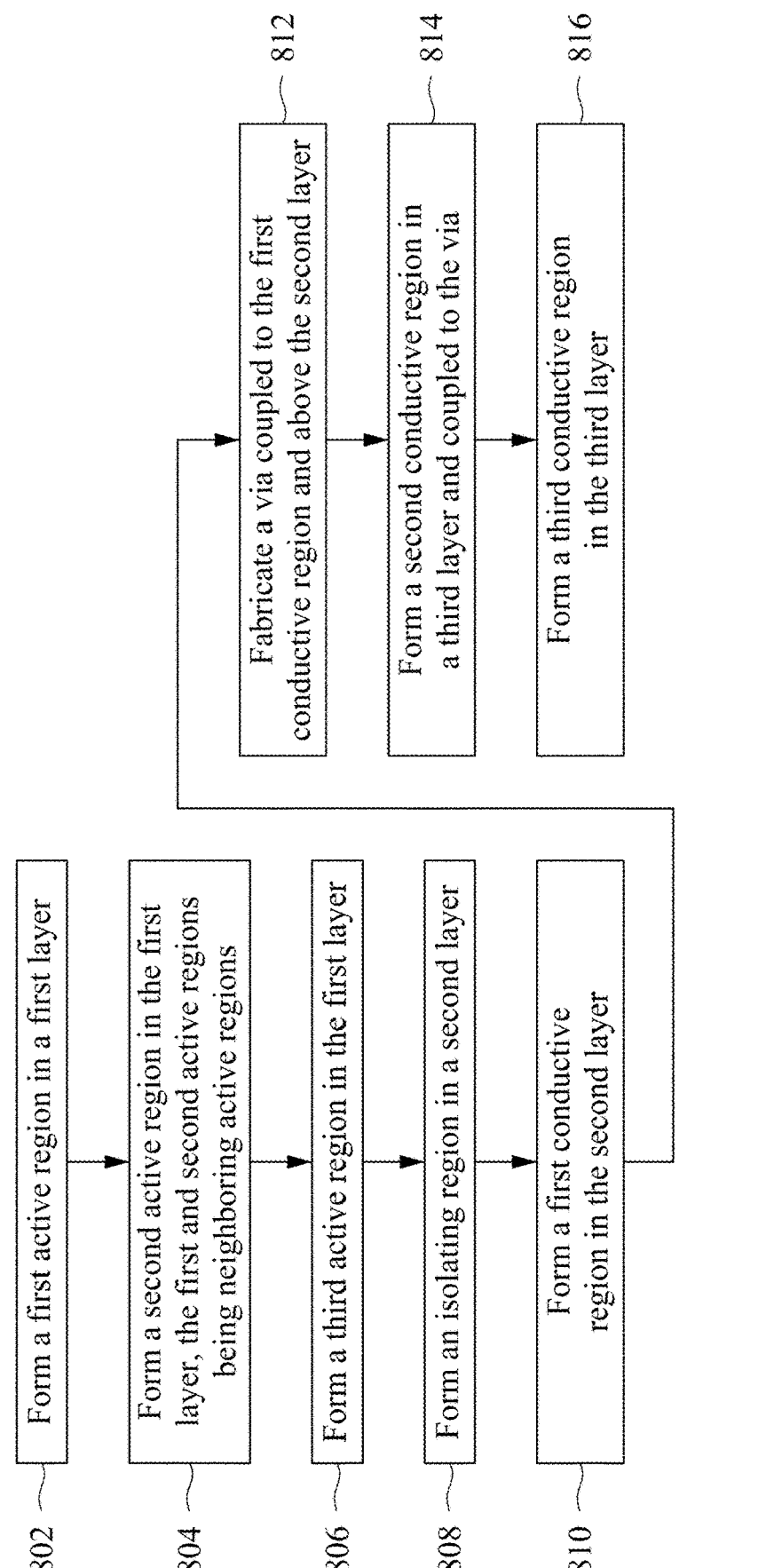

800

802  Form a first active region in a first layer

804  Form a second active region in the first layer, the first and second active regions being neighboring active regions 806  Form a third active region in the first layer 808  Form an isolating region in a second layer 810  Form a first conductive region in the second layer 812  Fabricate a via coupled to the first conductive region and above the second layer 814  Form a second conductive region in a third layer and coupled to the via 816  Form a third conductive region in the third layer

FIG. 8

SEMICONDUCTOR DEVICES WITH ACTIVE REGIONS AND CONDUCTIVE REGIONS OF TWO WIDTHS AND METHODS OF DESIGNING AND MANUFACTURING THE SAME

CROSS-REFERENCE TO RELATED APPLICATION

The present application claims the benefit of priority to U.S. Provisional Application No. 63/220,320, filed on Jul. 9, 2021, the entire contents of which are incorporated herein by reference.

BACKGROUND

The present disclosure relates to semiconductor devices and methods of designing and manufacturing the same.

In order to integrate more gates into a semiconductor device, a circuit having a small area is desirable. When the circuit area is reduced, operating speed of the circuit may be adversely affected. It may also be needed to avoid or at least mitigate speed degradation when a circuit having small area is designed and applied in the semiconductor device.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6A is a flowchart of an exemplary method performed by a computer for determining a width of an active region in a circuit cell stored in a memory, in accordance with some embodiments.

FIG. 8 is a flowchart of an exemplary method for fabricating an integrated circuit, in accordance with some embodiments.

DETAILED DESCRIPTION

Figure 1A:
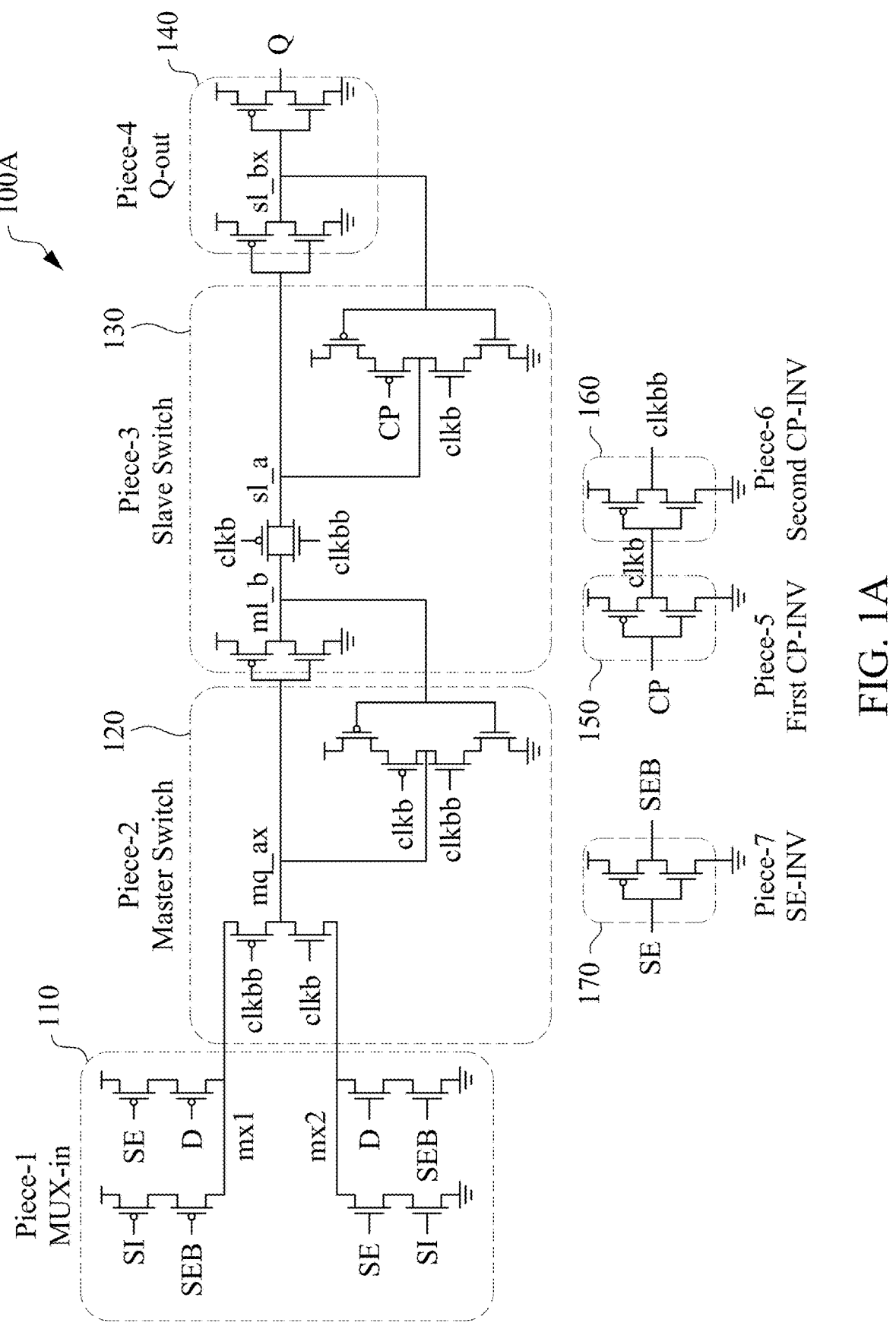
FIG. 1A illustrates a diagram of an exemplary three-metal-routing flip-flop circuit, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

In accordance with some embodiments of the present disclosure, the circuit area of integrated circuits may be reduced to integrate more gates. In some embodiments, an exemplary semiconductor device includes first, second, and third conductive regions and first and second active regions. The first and second active regions are neighboring active regions. The first conductive region has a first width and extends along a first direction. The second conductive region has a second width and extends along the first direction. The first width is greater than the second width. The first active region has a third width and extends along the first direction. The second active region has a fourth width and extends along the first direction. The third width is less than the fourth width. The third conductive region extends along a second direction and is electrically connected to the first conductive region. The second direction is different from the first direction. The first active region of a smaller width helps to reduce a circuit area of the semiconductor device.

In accordance with some embodiments, an exemplary semiconductor device comprises a three-metal-routing flip-flop circuit. For example, the flip-flop circuit includes a first conductive region having a first width and extending along a first direction. The flip-flop circuit also includes a second conductive region having a second width and extending along the first direction. The first width is greater than the second width. The flip-flop circuit also includes an active region having a third width and a fourth width, and extending along the first direction. The third width is less than the fourth width. In addition, the flip-flop circuit includes a third conductive region extending along a second direction and electrically connected to the first conductive region. The second direction is different from the first direction. The active region of the third width (i.e., a smaller width) also helps to reduce a circuit area of the flip-flop circuit.

FIG. 1A illustrates a diagram of an exemplary three-metal-routing flip-flop circuit 100A, in accordance with some embodiments. As shown in FIG. 1A, flip-flop circuit 100A includes a MUX-in circuit 110 (Piece-1), a master switch circuit 120 (Piece-2), a slave switch circuit 130 (Piece-3), a Q-out circuit 140 (Piece-4), a first clock phase inverter (CP-INV) circuit 150 (Piece-5), a second clock phase inverter (CP-INV) circuit 160 (Piece-6), and a sense enable inverter (SE-INV) circuit 170 (Piece-7). MUX-in circuit 110 (Piece-1), master switch circuit 120 (Piece-2), slave switch circuit 130 (Piece-3), and Q-out circuit 140 (Piece-4) are coupled in series as a flip-flop circuit with a scan input.

MUX-in circuit 110 (Piece-1) is configured to select a scan input (SI) signal or a data (D) input signal. Master switch circuit 120 (Piece-2) is configured to latch data when a clock phase (CP) signal is changed from 0 to 1 and to pass data when the CP signal is changed from 1 to 0. Slave switch circuit 130 (Piece-3) is configured to pass data when the CP signal is changed from 0 to 1 and to latch data when the CP signal is changed from 1 to 0. Q-out circuit 140 (Piece-4) is configured to output an output signal (Q). First CP-INV circuit 150 (Piece-5) and second CP-INV circuit 160 (Piece-6) are coupled in series to receive an input clock phase (CP) signal and output clock phase signals, clkb and clkbb, to master switch circuit 120 (Piece-2) and slave switch circuit 130 (Piece-3). SE-INV circuit 170 (Piece-7) receives a selection enable (SE) signal and outputs an inverted selection enable (SEB) signal to MUX-in circuit 110 (Piece-1).

Figure 1B:
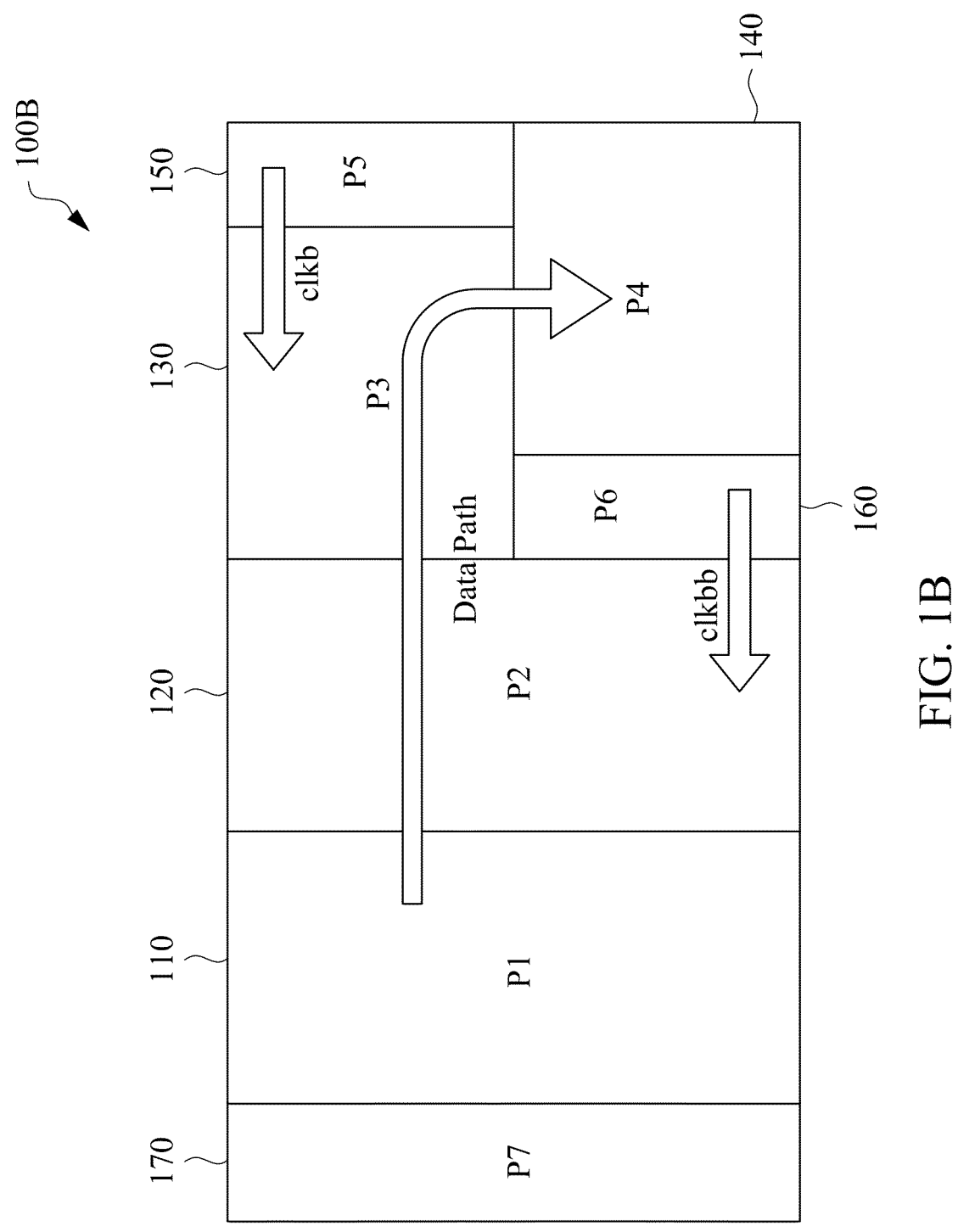
FIG. 1B illustrates a floor plan diagram of the exemplary three-metal-routing flip-flop circuit illustrated in FIG. 1A, in accordance with some embodiments.

FIG. 1B illustrates a floor plan diagram 100B of exemplary three-metal-routing flip-flop circuit 100A illustrated in FIG. 1A, in accordance with some embodiments. As shown in FIG. 1B, MUX-in circuit 110 (Piece-1), master switch circuit 120 (Piece-2), slave switch circuit 130 (Piece-3), and Q-out circuit 140 (Piece-4) are placed together as a data path. First CP-INV circuit 150 (Piece-5) and second CP-INV circuit 160 (Piece-6) are placed together with master switch circuit 120 (Piece-2) and slave switch circuit 130 (Piece-3) to provide clock phase signals, clkb and clkbb. SE-INV circuit 170 (Piece-7) is placed together with MUX-in circuit 110 (Piece-1).

Figure 1C:
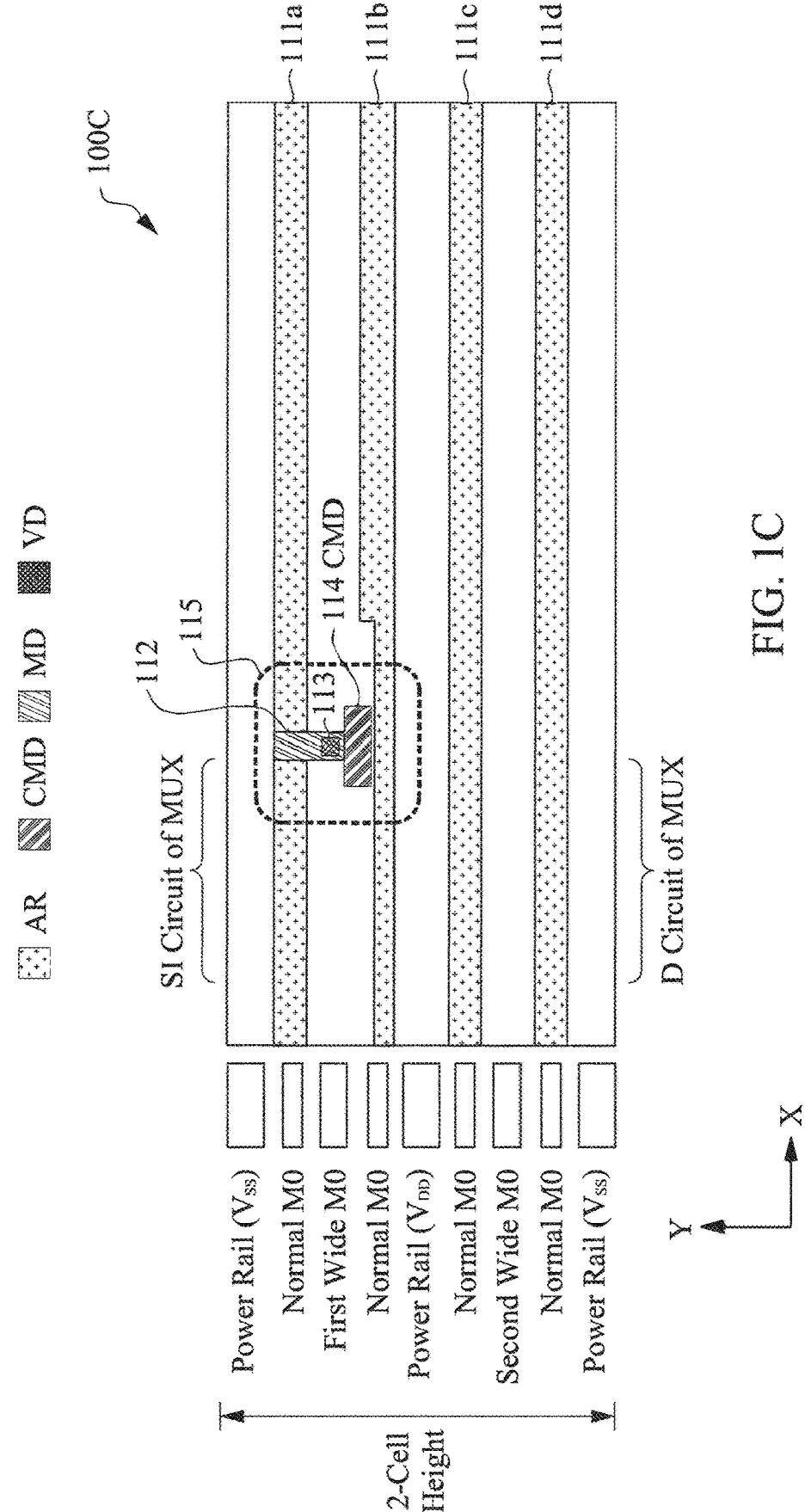
FIG. 1C illustrates a layout of the exemplary three-metal-routing flip-flop circuit illustrated in FIG. 1A, in accordance with some embodiments.

FIG. 1C illustrates a layout 100C of exemplary three-metal-routing flip-flop circuit 100A illustrated in FIG. 1A, in accordance with some embodiments. Layout 100C corresponds to floor plan diagram 100B (FIG. 1B) of three-metal-routing flip-flop circuit 100A (FIG. 1A). A left-upper part of layout 100C corresponds to a scan-input (SI) circuit of MUX-in circuit 110 (Piece-1). A bottom-left portion of layout 100C corresponds to a data (D) input circuit of MUX-in circuit 110 (Piece-1). Layout 100C has a two-cell height and includes space for three metal 0 (M0) regions (i.e., conductive regions) along the Y-axis direction within each cell height in the M0 layer. As shown on the left-hand side of FIG. 1C, labels along the Y-axis direction include Power Rail (Vss), Normal M0, First Wide M0, Normal M0, Power Rail (VDD), Normal M0, Second Wide M0, Normal M0, and Power Rail (Vss). These labels indicate positions along the Y-axis direction of their corresponding regions in layout 100C. The Normal M0 label indicates that an M0 region at this position has a required width in accordance with the semiconductor process of layout 100C. The First or Second Wide M0 label indicates that an M0 region at this position has a width wider than the required width in accordance with the semiconductor process of layout 100C. That is, the M0 region corresponding to the First or Second Wide M0 position has a width wider than the width of the M0 region corresponding to the Normal M0 position.

As shown in FIG. 1C, layout 100C includes active regions 111a, 111b, 111c, and 111d extending along the X-axis direction. An active region is a diffusion region that is a source or a drain of a transistor in a circuit. For example, active region 111a (FIG. 1C) comprises a plurality of diffusion regions that are sources and/or drains of transistors in exemplary three-metal-routing flip-flop circuit 100C (FIG. 1C). Layout 100C also includes one or more wide M0 regions (not shown) corresponding to the First and/or Second Wide M0 position in the Y-axis direction. The wide M0 regions have a greater width than that of other M0 regions (not shown) corresponding to Normal M0 positions along the Y-axis direction.

On an upper side, layout 100C includes a first active region 111a and a second active region 111b. Active region 111b has an AR-jog structure. That is, active region 111b has two different widths, where a first width of active region 111b is smaller than a second width of active region 111b. The second width of active region 111b is equal to widths of active regions 111a, 111c, and 111d, i.e., a normal width of an active region in layout 100C.

On the upper side, layout 100C includes a metal diffusion (MD) region 112, i.e., a conductive region, over active region 111a. MD region 112 extends along the Y-axis direction and toward active region 111b having the first width, i.e., the smaller (first) width of active region 111b. MD region 112 is separated from active region 111b having the first width by a cut MD ("CMD") region 114 (i.e., an isolating region). CMD region 114 is a nonconductive region between MD region 112 and an MD region 116 (FIG. 2C). CMD region 114 is formed by cutting an MD region into MD regions 112 and 116 (FIG. 2C) and isolates MD region 112 from MD region 116 (FIG. 2C). MD region 112 is electrically connected to the first wide M0 region by a via (VD) 113, i.e., a via coupled between the first wide M0 region and MD region 112.

The smaller width of active region 111b provides layout 100C with a reduced area. CMD region 114 separates MD region 112 from active region 111b with the smaller width (i.e., a small active region). VD 113 electrically connects MD region 112 to the first wide M0 region (not shown in FIG. 1C; see, e.g., wide M0 region 117 in FIG. 2B) in order to connect to other circuits of layout 100C. As shown in FIG. 1C, a region 115 includes a part of active region 111a, a part of active region 111b with the smaller width (i.e., the small active region), VD 113, CMD region 114, and a part of the first wide M0 region (not shown in FIG. 1C; see, e.g., wide M0 region 117 in FIG. 2B). More details of region 115 are described below with reference to FIGS. 2A-2F.

Figure 2A:
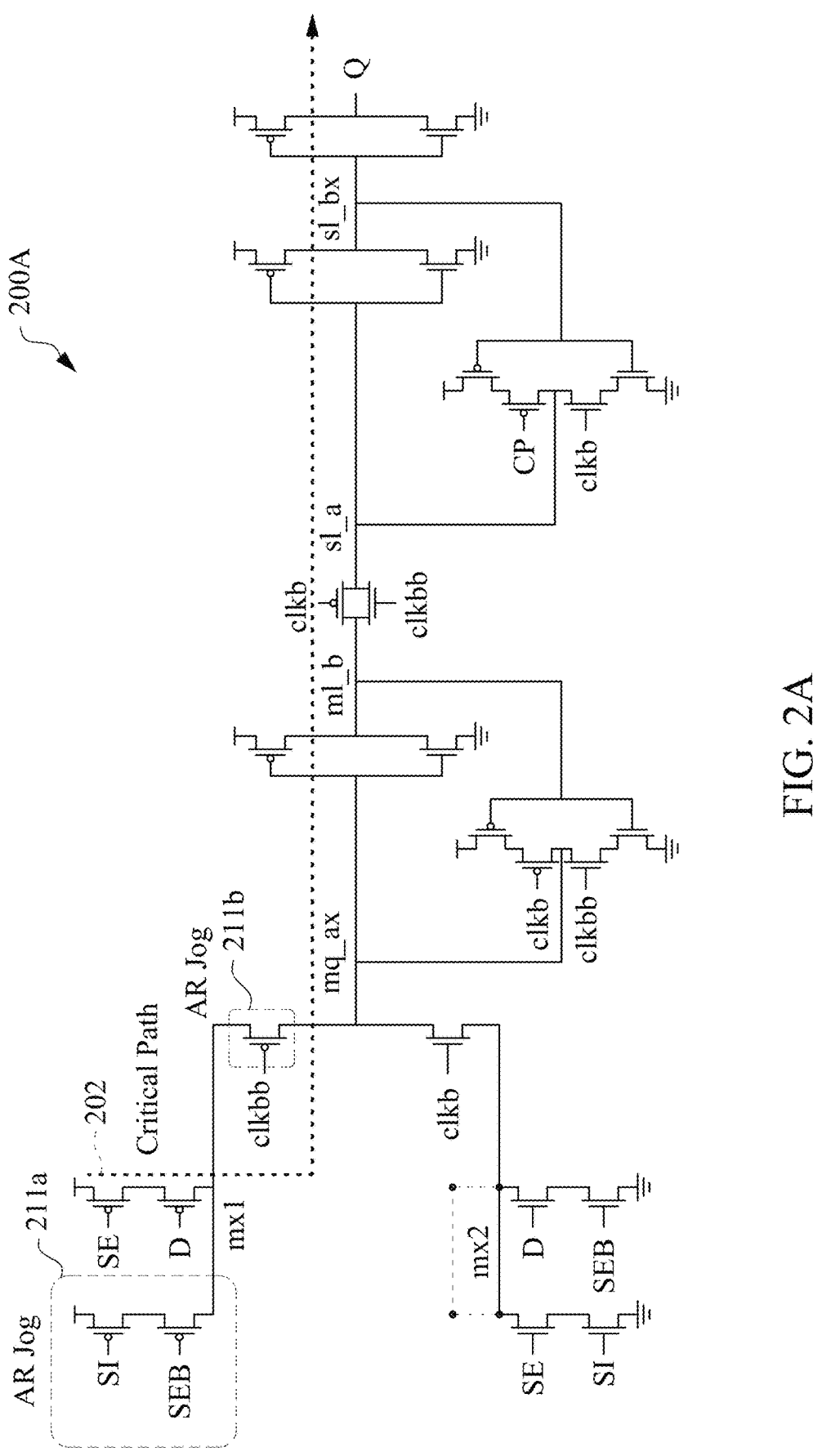
FIG. 2A illustrates a circuit of a portion of the exemplary three-metal-routing flip-flop circuit illustrated in FIG. 1A, in accordance with some embodiments.

FIG. 2A illustrates a circuit 200A of a portion of exemplary three-metal-routing flip-flop circuit 100A illustrated in FIG. 1A, in accordance with some embodiments. Circuit 200A corresponds to the flip-flop circuit with the scan input in FIG. 1A, including MUX-in circuit 110 (Piece-1), master switch circuit 120 (Piece-2), slave switch circuit 130 (Piece-3), and Q-out circuit 140 (Piece-4). As shown in FIG. 2A, circuit 200A includes a critical path 202 from a data (D) input circuit of a first multiplexer (i.e., mx1) to an output circuit. Critical path 202 is the longest circuit path of circuit 200A in terms of electrical signal propagation.

As shown in FIG. 2A, a scan input (SI) circuit 211a of the first multiplexer (i.e., mx1) and a p-type transistor 211b have AR-jog structures. The AR-jog structures of SI circuit 211a and p-type transistor 211b correspond to a part of active region 111b of the smaller width (i.e., the small active region) in FIG. 1C. That is, instead of the data (D) input circuit, the AR-jog structure is applied to the SI circuit of the first multiplexer (i.e., mx1) to avoid delaying signal propagation on critical path 202 of circuit 200A. Although the AR-jog structure is also applied to p-type transistor 211b on critical path 202, it affects only slightly the signal propagation.

Circuit 200A includes a second multiplexer (i.e., mx2) for an SI input and a D input. The SI and D input circuits of the second multiplexer (i.e., mx2) are connected together through metal regions.

Figure 2B:
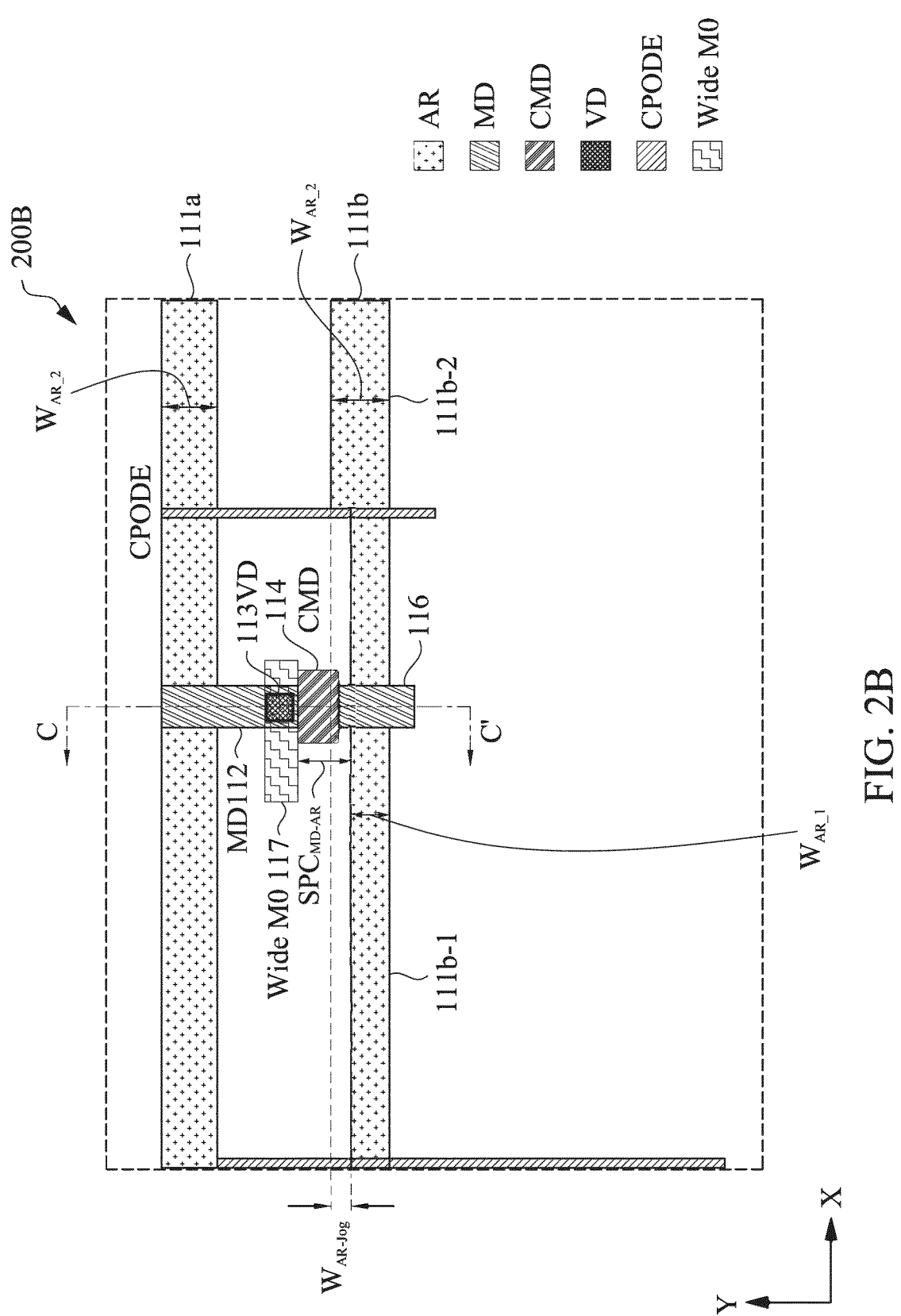
FIG. 2B illustrates a layout of a portion of the exemplary three-metal-routing flip-flop circuit illustrated in FIG. 2A, in accordance with some embodiments.
Figure 2C:
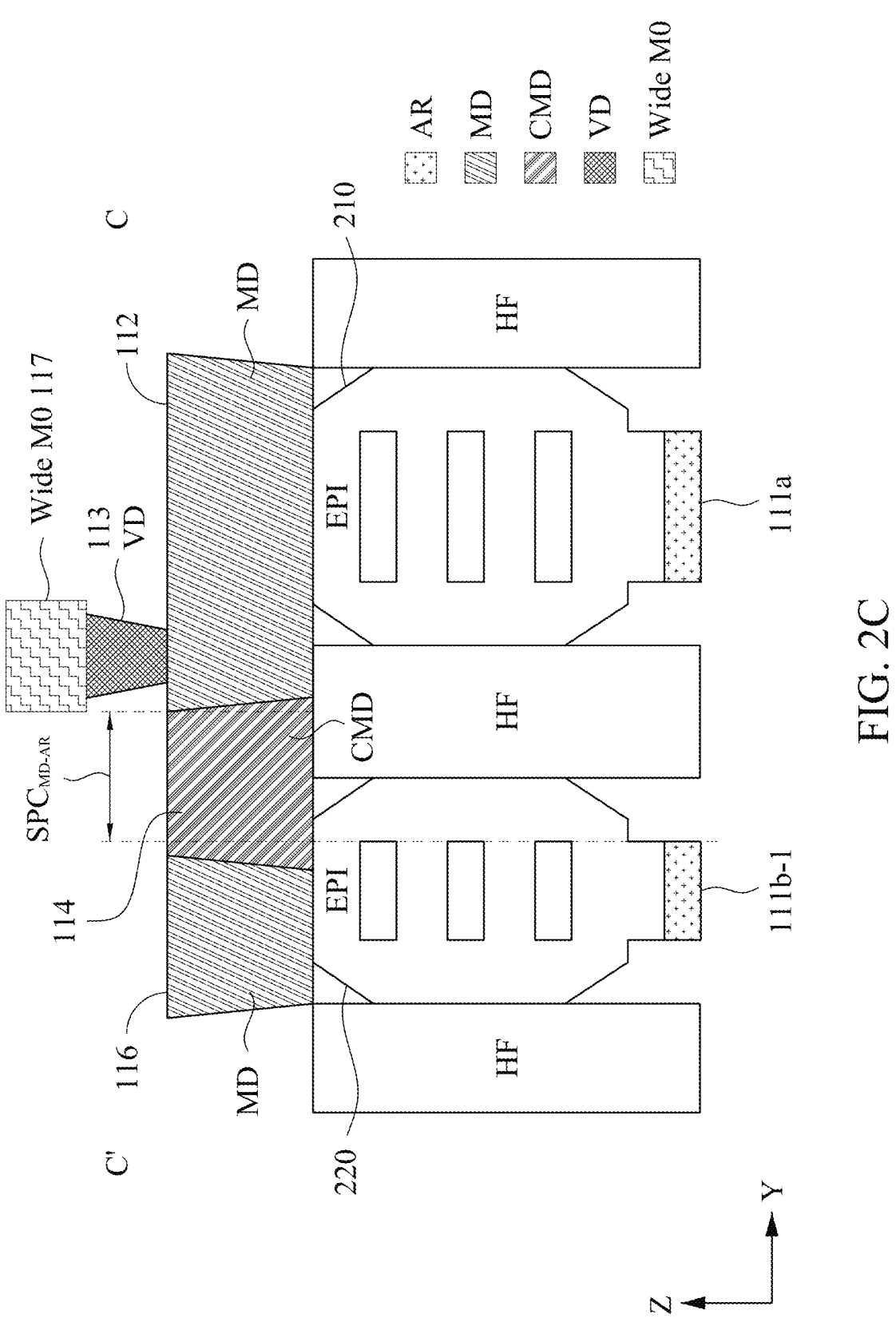
FIG. 2C illustrates a cross-sectional view in the layout illustrated in FIG. 2B, in accordance with some embodiments.

FIG. 2B illustrates a layout 200B of a portion of exemplary three-metal-routing flip-flop circuit 200A illustrated in FIG. 2A, in accordance with some embodiments. Layout 200B corresponds to a left side of layout 100C in FIG. 1C. As shown in FIG. 2B, layout 200B includes active regions 111a, 111b-1, and 111b-2, MD regions 112 and 116, CMD region 114, VD 113, and a wide M0 region 117. VD 113 electrically connects MD region 112 to wide M0 region 117. Active region 111a has the second width of $W_{AR\_2}$ and corresponds to active region 111a with the normal width in FIG. 1C. Active region 111b-1 has the first width of $W_{AR\_1}$ and corresponds to active region 111b with the smaller width in FIG. 1C. Active region 111b-2 has the second width of $W_{AR\_2}$ and corresponds to a region of active region 111b with the normal width in FIG. 1C. Active regions 111b-1 and 111b-2 are coupled together by a common polysilicon on oxide diffusion edge (CPODE).

As shown in FIG. 2B, the width $W_{AR\_1}$ is less than the width $W_{AR\_2}$ by a differential width of $W_{AR\text{-}jog}$. The differential width of $W_{AR\text{-}jog}$ is a reduced width of active region 111b-1 in layout 200B. MD region 112 is separated from active region 111b-1 by a space of $SPC_{MD\text{-}AR}$.

FIG. 2C illustrates a cross-sectional view CC' in layout 200B illustrated in FIG. 2B, in accordance with some embodiments. As shown in FIG. 2C, the cross-section view CC' includes active regions 111a and 111b-1, epitaxy (EPI) regions 210 and 220, hyper-fin (HF) regions (not labeled), MD regions 112 and 116, VD 113, CMD region 114, and wide M0 region 117. EPI region 210 and active region 111a are separated from EPI region 220 and active region 111b-1 by an HF region. CMD region 114 separates MD region 112 from active region 111b-1 by the space of $SPC_{MD\text{-}AR}$. The space of $SPC_{MD\text{-}AR}$ is required to be greater than a threshold space to avoid time-dependent dielectric breakdown (TDDB). Active region 111b-1 has the smaller width to accommodate the required space of $SPC_{MD\text{-}AR}$. In addition, the AR-jog structure helps to avoid or mitigate MD-EPI leakage between MD region 112 and EPI region 220. Accordingly, the small active region of the AR-jog structure reduces circuit areas and does not increase requirements of semiconductor manufacturing processes.

Figure 2D:
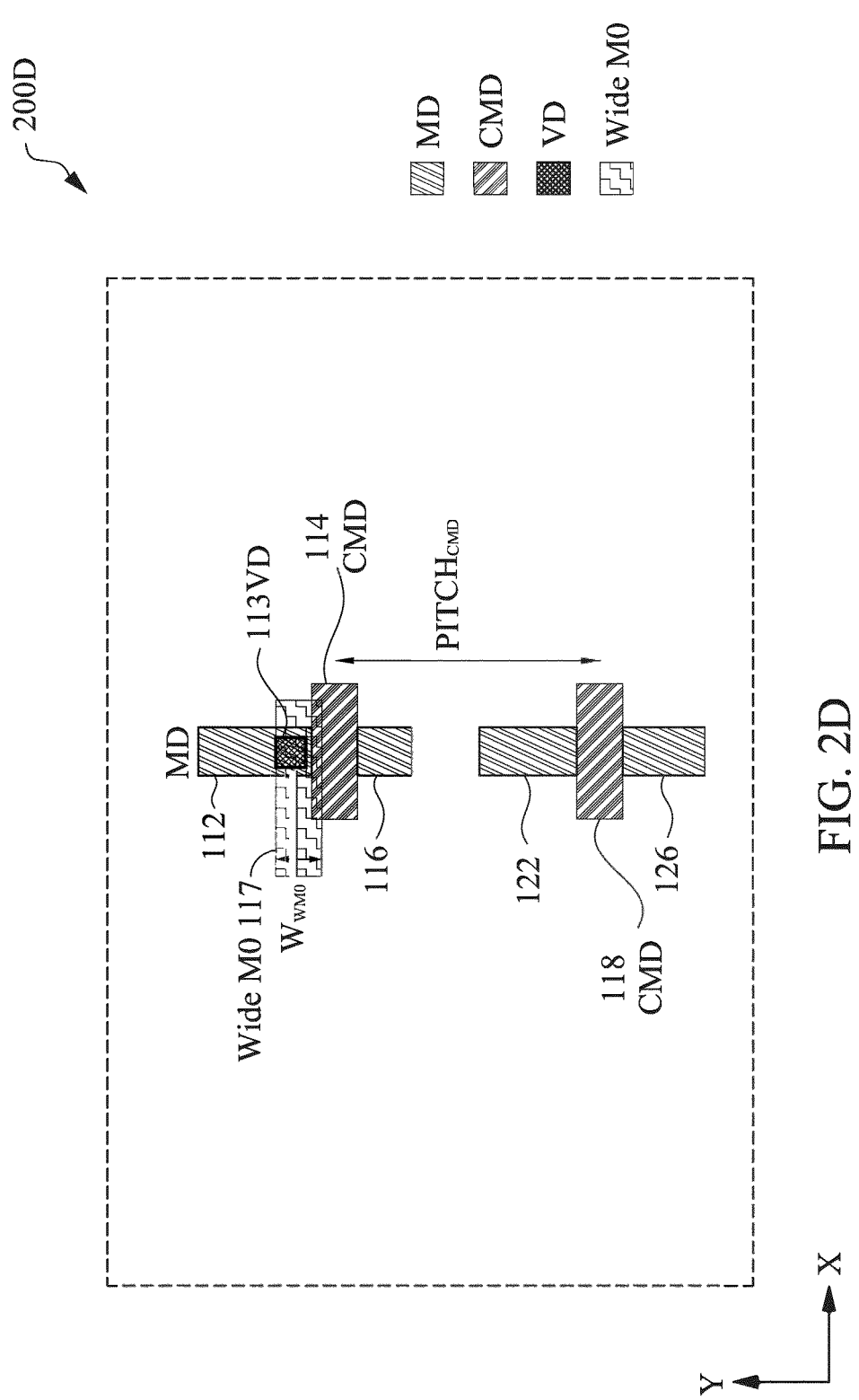
FIG. 2D illustrates a layout of a portion of the exemplary three-metal-routing flip-flop circuit illustrated in FIG. 1C, in accordance with some embodiments.

FIG. 2D illustrates a layout 200D of a portion of exemplary three-metal-routing flip-flop circuit 200A illustrated in FIG. 2A, in accordance with some embodiments. Layout 200D corresponds to layout 200B in FIG. 2B and includes additional details of CMD regions. As shown in FIG. 2D, MD region 112 is electrically connected to wide M0 region 117. Wide M0 region 117 has a width of $WVM_0$, the width of $W_{VM0}$ being greater than a width of the other M0 regions within a cell height in layout 100C (FIG. 1C).

As shown in FIG. 2C, CMD region 114 is formed between CMD regions 112 and 116 in light of the AR-jog structure. In FIG. 2D, layout 200D also includes MD regions 122 and 126, and a CMD region 118 therebetween. CMD region 118 is at a distance of $PITCH_{CMD}$ from CMD region 114. The distance of $PITCH_{CMD}$ is required to be greater than a threshold of pitch so that CMD regions 114 and 118 and other CMD regions of layout 200D can be manufactured by a single-patterning and single-etching (1P1E) method. That is, any two given CMD regions of layout 200D are spaced apart from each other by at least the threshold of pitch; therefore, there is no need to use two photomask patterns for manufacturing the two CMD regions.

Figure 2E:
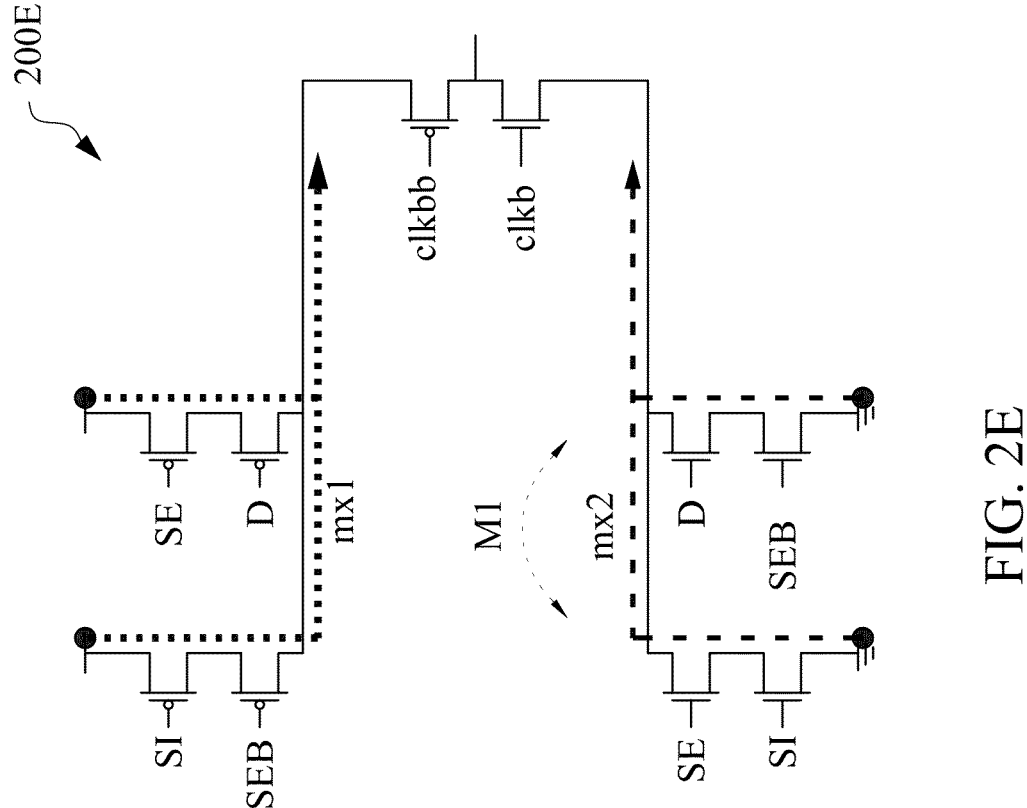
FIG. 2E illustrates a circuit of a portion of the exemplary three-metal-routing flip-flop circuit illustrated in FIG. 2A, in accordance with some embodiments.

FIG. 2E illustrates a circuit 200E of a portion of exemplary three-metal-routing flip-flop circuit 200A illustrated in FIG. 2A, in accordance with some embodiments. As shown in FIG. 2E, circuit 200E includes two multiplexers mx1 and mx2. Multiplexers mx1 and mx2 each include an SI input circuit and a D input circuit. The SI and D input circuits of multiplexer mx1 are supplied with a positive voltage level (i.e., VDD). The SI and D input circuits of multiplexer mx2 are supplied with a negative voltage level (i.e., Vss).

Figure 2F:
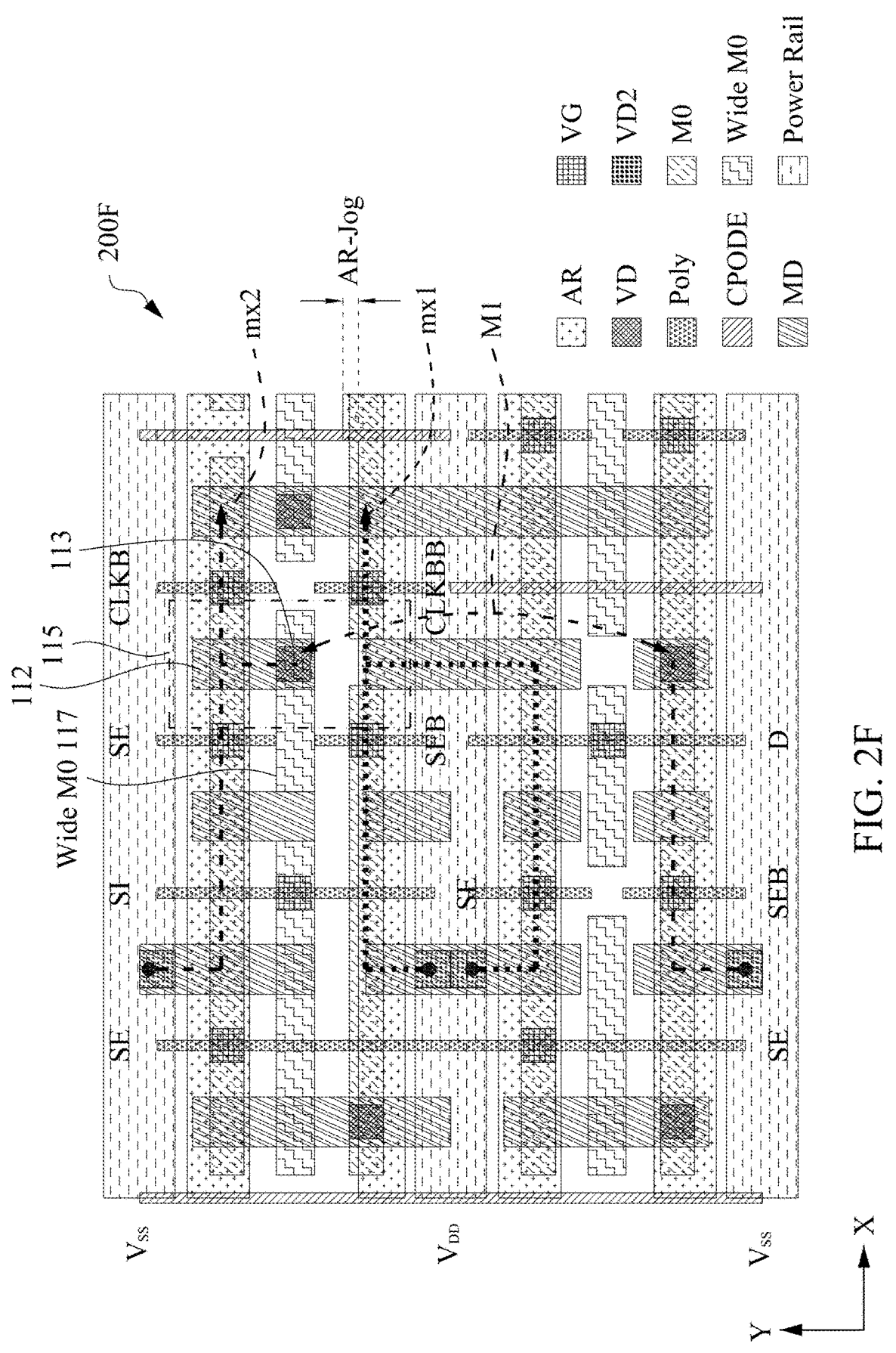
FIG. 2F illustrates a layout of the portion of the exemplary three-metal-routing flip-flop circuit illustrated in FIG. 2A, in accordance with some embodiments.

FIG. 2F illustrates a layout 200F of a portion of exemplary three-metal-routing flip-flop circuit 200A illustrated in FIG. 2A, in accordance with some embodiments. Layout 200F implements circuit 200E. A middle part of layout 200F implements multiplexer mx1. As shown in FIG. 2F, an AR-jog structure is applied to the SI input path of multiplexer mx1. An upper part and a lower part of layout 200F respectively implement the SI and D input circuits of multiplexer mx2. The SI input circuit is coupled together with the D input path through a metal 1 (M1) region. Table I below lists, without limitation, a plurality of exemplary region sizes of layout 200F in a three-metal-routing circuit cell of a 2 nanometers (nm) process. A special construct MD length is a length of a special MD region (e.g., MD 112) that is coupled to a wide M0 region (e.g., wide M0 region 117) through a via (e.g., VD 113).

TABLE I

| Items | Value (nm) |
| --- | --- |
| Cell height | 92 |
| PO pitch | 45 |
| NP space | 28 |
| AR width | 18 |
| Small AR width | 13.5 |
| AR jog | 4.5 |
| MD to AR space | 13 |
| MD width | 15 |
| MD space_Y | 15 |
| Min. MD length | 23 |
| Special construct MD length | 36(≥23 + 10) |
| VD width | 10 |
| Enclosure VD/MD | 1 |
| Enclosure VD/M0 | 0 |
| M0 width | 10 |
| Wide M0 width | 11 |
| M0 space | 10 |

In some embodiments, an exemplary flip-flop circuit includes a first conductive region, a second conductive region, a third conductive region, and an active region. The first conductive region has a first width and extends along a first direction. The second conductive region has a second width and extends along the first direction. The first width is greater than the second width. The third conductive region extends along a second direction and is electrically connected to the first conductive region. The second direction is different from the first direction. The active region has a third width and a fourth width and extends along the first direction. The third width is less than the fourth width.

For example, as shown in FIGS. 2A-2F and with reference to the exemplary dimensions in Table I, three-metal-routing flip-flop circuit 200A includes wide M0 region 117 (FIG. 2D), i.e., a conductive region. Wide M0 region 117 has a width of $W_{VM0}$ and extends along the X-axis direction. The width of wide M0 region 117 is 11 nanometers (nm) (Table I), i.e., $W_{VM0}$=11 nm. Three-metal-routing flip-flop circuit 200A also includes an M0 region corresponding to the Normal M0 position in FIG. 1C. The M0 region is a conductive region, has a width of $W_{M0}$, and extends along the X-axis direction. The width of the M0 region is 10 nm (Table I), i.e., $W_{M0}$=10 nm. The width of wide M0 region 117 (i.e., 11 nm) is greater than the width of the M0 region (i.e., 10 nm).

Three-metal-routing flip-flop circuit 200A also includes active region 111b (FIG. 2B or 1C), i.e., an active region. Active region 111b extends along the X-axis direction and has the width $W_{AR\_1}$ of active region 111b-1 and the width $W_{AR\_2}$ of active region 111b-2. The width $W_{AR\_1}$ of active region 111b-1 is 13.5 nm (Table I), i.e., $W_{AR\_1}$=13.5 nm. The width $W_{AR\_2}$ of active region 111b-2 is 18 nm (Table I), i.e., $W_{AR\_1}$=18 nm. The width $W_{AR\_1}$ of active region 111b-1 (i.e., 13.5 nm) is less than the width $W_{AR\_2}$ of active region 111b-2 (i.e., 18 nm). Three-metal-routing flip-flop circuit 200A also includes MD region 112 (FIG. 2B), i.e., a conductive region. MD region 112 extends along the Y-axis direction and is electrically connected to wide M0 region 117 by VD 113. The Y-axis direction is different from the X-axis direction.

In some embodiments, in the above exemplary flip-flop circuit having the first, second, and third conductive regions and the active region, the first, second, and third conductive regions and the active region are a first plurality of circuits. The exemplary flip-flop circuit also includes a second plurality of circuits. The second plurality of circuits includes a longest circuit path of the exemplary flip-flop circuit. For example, in addition to wide M0 region 117 (FIG. 2D), the M0 region corresponding to the Normal M0 position above the First Wide M0 (FIG. 1C), MD region 112 (FIG. 2B), and active region 111b (FIG. 1C), considered to be a first plurality of circuits, three-metal-routing flip-flop circuit 200A (FIG. 2A) also includes a second plurality of circuits along critical path 202 from the D input circuit of multiplexer mx1 to the output circuit (Q).

In some embodiments, the above exemplary flip-flop circuit, having the first, second, and third conductive regions and the active region, has a multiplexer. The multiplexer includes a data input circuit and a scan input circuit. The scan input circuit includes at least a part of the first active region. For example, as shown in FIG. 2A, three-metal-routing flip-flop circuit 200A includes multiplexer mx1. Multiplexer mx1 includes the D input circuit and the SI input circuit. As shown in FIG. 2F, the SI input circuit of multiplexer mx1 is implemented through active region 111b-1 (FIG. 2B). Active region 111b-1 is a part of active region 111b (FIG. 2B).

Figure 3:
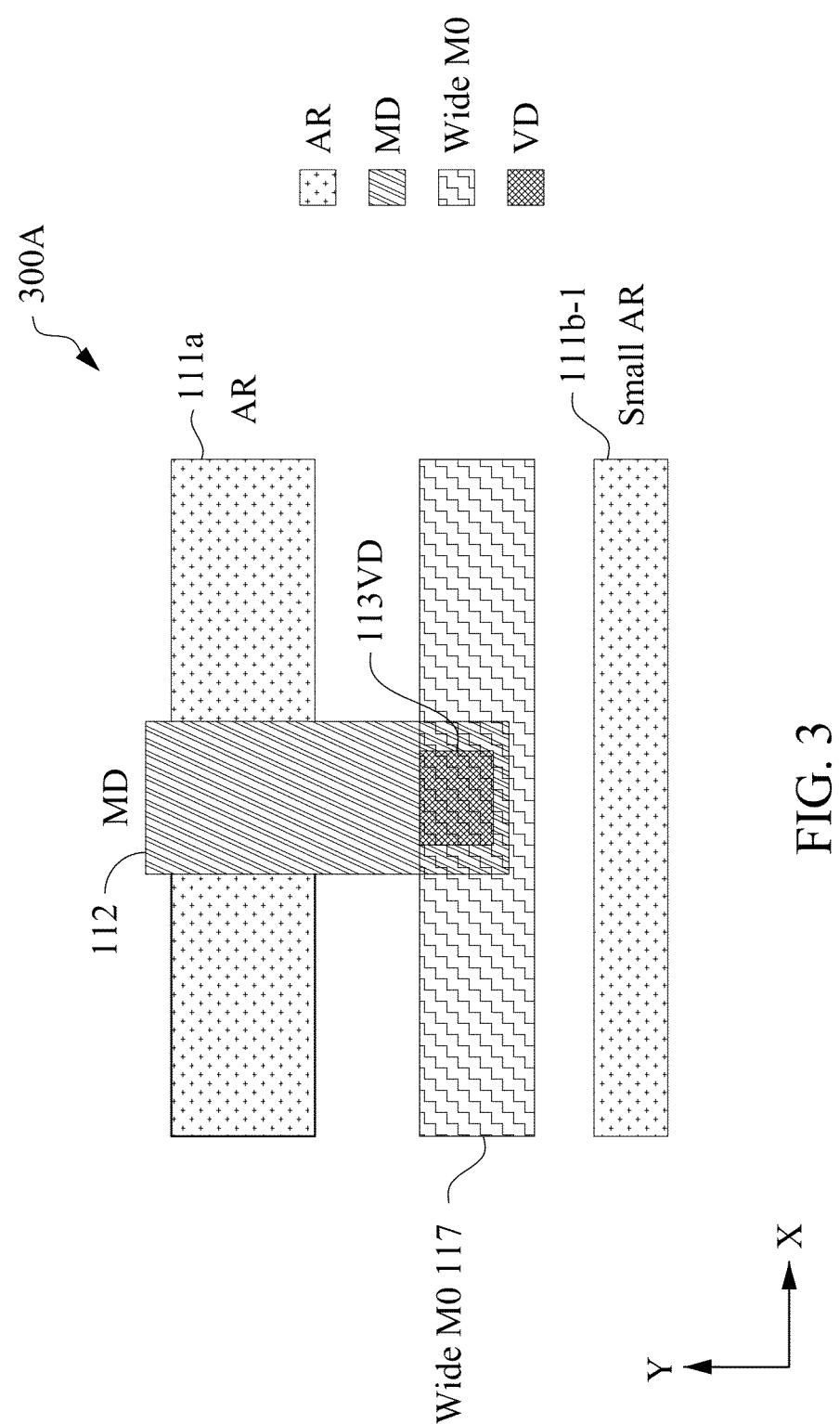
FIG. 3 illustrates a layout of an exemplary part of a circuit cell including a small active region (AR), in accordance with some embodiments.

FIG. 3 illustrates a layout 300A of an exemplary part of a circuit cell including a small active region, in accordance with some embodiments. The circuit cell including layout 300A may be flip-flop circuit 100A or 200A (FIG. 1A-1C or 2A-2F), an AND gate, a NAND gate, an OR gates, a NOR gate, an XOR gate, an XNOR gate, a multiplexer, an inverter, a flip-flop, a latch, an adder, or other circuits. The circuit cell may be used to implement a variety of circuits for various applications. As shown in FIG. 3, layout 300A includes active region 111a, small active region 111b-1, MD region 112, VD 113, and wide M0 region 117. These regions and via are described above with reference to FIGS. 1A-1C and 2A-2F.

In some embodiments, an exemplary semiconductor device includes a first conductive region, a second conductive region, a third conductive region, a first active region, and a second active region. The first conductive region has a first width and extends along a first direction. The second conductive region has a second width and extends along the first direction. The first width is greater than the second width. The first active region has a third width and extends along the first direction. The second active region has a fourth width and extends along the first direction. The third width is less than the fourth width. The third conductive region extends along a second direction and is electrically connected to the first conductive region. The second direction is different from the first direction. The first and second active regions are neighboring active regions.

For example, when a semiconductor device is implemented by the circuit cell including layout 300A, the semiconductor device includes wide M0 region 117 (i.e., a conductive region), as shown in FIG. 3. Wide M0 region 117 has a width of $W_{VM0}$ (e.g., 11 nm) and extends along the X-axis direction. The semiconductor device also includes the M0 region of normal width (not shown) above wide M0 region 117 (i.e., a conductive region), as described above with reference to FIG. 1C. The M0 region has a width of $WM_0$ (e.g., 10 nm) and extends along the X-axis direction. The width $W_{VM0}$ (e.g., 11 nm) of wide M0 region 117 is greater than the width $WM_0$ (e.g., 10 nm) of the M0 region.

The semiconductor device also includes small active region 111b-1 (i.e., an active region). Active region 111b-1 has a width of $W_{AR\_1}$ (e.g., 13.5 nm) and extends along the X-axis direction. The semiconductor device also includes active region 111a (i.e., an active region). Active region 111a has a width of $W_{AR\_2}$ (e.g., 18 nm) and extends along the X-axis direction. The width $W_{AR\_1}$ (e.g., 13.5 nm) of active region 111b-1 is less than the width $W_{AR\_2}$ (e.g., 18 nm) of active region 111a. The semiconductor device also includes MD region 112 (i.e., a conductive region). MD region 112 extends along the Y-axis direction and is electrically connected to wide M0 region 117 through VD 113. The Y-axis direction is different from the X-axis direction. Wide M0 region 117, the M0 region above wide M0 region 117, MD region 112, active region 111b-1, and active region 111a, VD 113 are in the circuit cell implementing three-metal-routing flip-flop circuit 100A or 200A. Active regions 111a and 111b-1 are next to each other and therefore are neighboring active regions.

In some embodiments, in the above exemplary semiconductor device, having the first, second, and third conductive regions and the first and second active regions, the first conductive region is in a first layer. The third conductive region is in a second layer. The second direction is perpendicular to the first direction. For example, in the above semiconductor device implemented by the circuit cell including layout 300A, wide M0 117 is in a metal 0 layer. MD 112 is in an MD layer. The Y-axis direction is perpendicular to the X-axis direction.

In some embodiment, the above exemplary semiconductor device, having the first, second, and third conductive regions and the first and second active regions, also includes a via coupled between the first conductive region and the third conductive region. The via has a fifth width equal to or less than the first width of the first conductive region. For example, in the above semiconductor device implemented by the circuit cell including layout 300A, VD 113 is coupled between wide M0 region 117 and MD region 112. VD 113 has a width of $W_{VD}$. The width $W_{VD}$ is, for example, 10 nm (Table I). The width $W_{VD}$ (e.g., 10 nm) of VD 113 is less than the width $W_{VM0}$ (e.g., 11 nm) of wide M0 region 117.

In some embodiments, the above exemplary semiconductor device, having the first, second, and third conductive regions and the first and second active regions, also includes a third active region. The third active region has the fourth width of the second active region and extends along the first direction. The third active region is coupled to the first active region. For example, the above semiconductor device implemented by the circuit cell including layout 300A includes active region 111b-2 (i.e., an active region), as described above with reference to FIG. 2B. Active region 111b-2 has a width of $W_{AR\_2}$ (e.g., 18 nm) and extends along the X-axis direction. Active region 111b-2 is coupled to active region 111b-1.

In some embodiments, in the above exemplary semiconductor device having the first, second, and third conductive regions and the first and second active regions, a space between the third conductive region and the first active region is equal to or greater than a threshold of space. For example, in the above semiconductor device implemented by the circuit cell including layout 300A, the space $SPC_{MD-AR}$ (FIG. 2B or 2C) between MD region 112 and active region 111b-1 is equal to or greater than a threshold of space in a design rule of circuit cell libraries. The space $SPC_{MD-AR}$ is, for example, 13 nm (Table I). In accordance with the design rule of the circuit cell libraries, the threshold of space is, for example, 12 nm. The space $SPC_{MD-AR}$ (e.g., 13 nm) is greater than the threshold of space (e.g., 12 nm).

In some embodiments, the above exemplary semiconductor device, having the first, second, and third conductive regions and the first and second active regions, also includes a fourth conductive region. The fourth conductive region has the second width and extends along the first direction. The first, second, and fourth conductive regions are in a first layer. The third conductive region is in a second layer and extends along the second direction perpendicular to the first direction. For example, the above semiconductor device implemented by the circuit cell including layout 300A further includes an M0 region along with the Normal M0 position below First Wide M0 (i.e., a conductive region), as described above with reference to FIG. 1C. The M0 region has a width of $W_{M0}$ (e.g., 10 nm) and extends along the X-axis direction. Wide M0 117 and two M0 regions with the width of $W_{M0}$ are in the metal 0 layer. MD 112 is the MD layer and extends along the Y-axis direction perpendicular to the X-axis direction.

In some embodiments, the above exemplary semiconductor device, having the first, second, and third conductive regions and the first and second active regions, also includes a fourth conductive region and an isolating region. The fourth conductive region extends along the second direction. The isolating region extends along the second direction and is formed between the third and fourth conductive regions. For example, the above semiconductor device implemented by the circuit cell including layout 300A further includes MD region 116 (i.e., a conductive region), as described above with reference to FIG. 2C. MD region 116 extends along the Y-axis direction. The semiconductor device also includes CMD region 114 (i.e., an isolating region), as described above with reference to FIG. 2C. CMD 114 extends along the Y-axis direction and is formed between MD regions 112 and 116.

In some embodiments, in the above exemplary semiconductor device having the first, second, third, and fourth conductive regions, the first and second active regions, and the isolating region, the first and second active regions are in a first layer. The third and fourth conductive regions and the isolating region are in a second layer. The second layer is different from the first layer. The third conductive region extends in the second layer and above the second active region in the first layer. The fourth conductive region extends in the second layer and above the first active region in the first layer.

For example, in the above semiconductor device implemented by the circuit cell including layout 300A, active regions 111a and 111b-1 are in the AR layer. MD regions 112 and 116 and CMD region 114 are in the MD layer, as illustrated above with reference to FIG. 2C. The MD layer is different from the AR layer. MD region 112 extends in the MD layer and above active region 111a in the AR layer. MD region 116 extends in the MD layer and above active region 111b-1 in the AR layer.

In some embodiments, in the above exemplary semiconductor device having the first, second, third, and fourth conductive regions, the first and second active regions, and the isolating region, the isolating region is a first isolating region. The exemplary semiconductor device also includes a second isolating region extending along the second direction. The first and second isolating regions are on opposite sides of the first active region. A distance between the first and second isolating regions is equal to or greater than a threshold distance. For example, the above semiconductor device implemented by the circuit cell including layout 300A further includes CMD region 118 (i.e., an isolating region), as described above with reference to FIG. 2D. CMD region 118 extends along the Y-axis direction. CMD regions 114 and 118 are on opposite sides of active region 111b-1, as described below with reference to FIG. 4A or 4B. The distance $PITCH_{CMD}$ between CMD regions 114 and 118 is equal to or greater than a threshold distance.

In addition to the AR structure in layout 300A (FIG. 3), this disclosure is also directed to a plurality of circuit cells including AR-jog structures, as described below with reference to FIGS. 4A-4C and 5A-5C. These circuit cells, including the AR-jog structures, may be flip-flop circuit 100A or 200A (FIG. 1A-1C or 2A-2F), an AND gate, a NAND gate, an OR gates, a NOR gate, an XOR gate, an XNOR gate, a multiplexer, an inverter, a flip-flop, a latch, an adder, or other circuits. These circuit cells may be used to implement a variety of circuits for various applications.

Figure 4A:
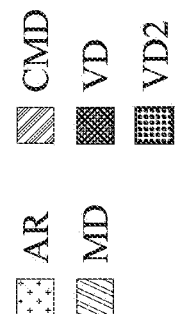
FIG. 4A illustrates a layout of an exemplary double-height circuit cell including an AR-jog structure, in accordance with some embodiments.
Figure 4A:
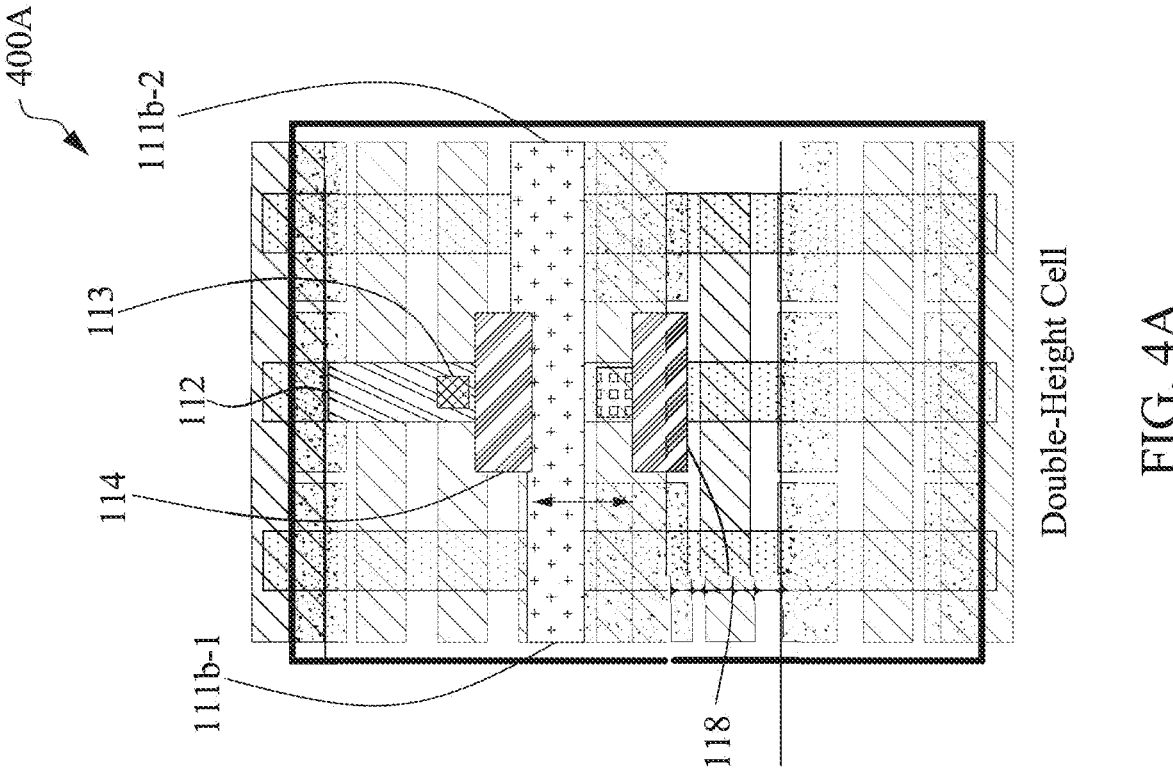
Figure 4A:
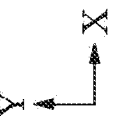

FIG. 4A illustrates a layout 400A of an exemplary double-height circuit cell including an AR-jog structure, in accordance with some embodiments. As shown in FIG. 4A, layout 400A of the double-height circuit cell includes active regions 111$b$-1 and 111$b$-2, MD region 112, VD 113, and CMD regions 114 and 118. These regions and via are described above with reference to FIGS. 1A-1C and 2A-2F. Active regions 111$b$-1 and 111$b$-2, MD region 112, VD 113, and CMD region 114 are within an upper cell-height range of the circuit cell. CMD region 118 is within a bottom cell-height range of the circuit cell. CMD region 118 is at a distance of PITCH$_{CMD}$ from CMD region 114, as described above with reference to FIG. 2D. As shown in FIG. 4A, CMD regions 114 and 118 are on opposite sides of active region 111$b$-1. For clarity of illustration, a CPODE structure above the edge active regions 111$b$-1 and 111$b$-2, as shown in FIG. 2B, is not shown in FIG. 4A.

Figure 4B:
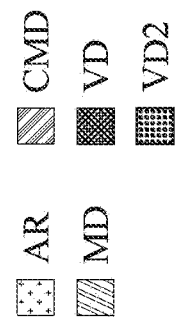
FIG. 4B illustrates a layout of another exemplary double-height circuit cell including an AR-jog structure, in accordance with some embodiments.
Figure 4B:
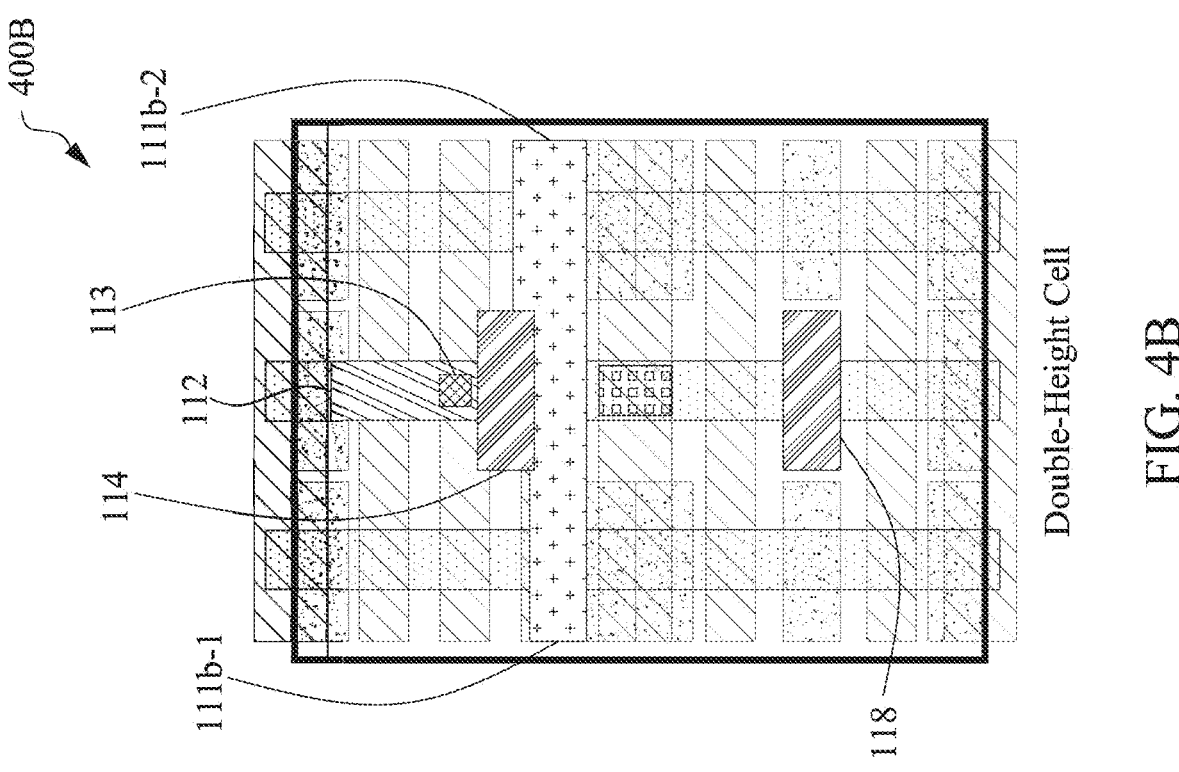
Figure 4B:

FIG. 4B illustrates a layout 400B of an exemplary double-height circuit cell including an AR-jog structure, in accordance with some embodiments. As shown in FIG. 4B, layout 400B of the double-height circuit cell includes active regions 111$b$-1 and 111$b$-2, MD region 112, VD 113, and CMD regions 114 and 118. These regions and via are described above with reference to FIGS. 1A-1C and 2A-2F. Active regions 111$b$-1 and 111$b$-2, MD region 112, VD 113, and CMD region 114 are within an upper cell-height range of the circuit cell. CMD region 118 is within a bottom cell-height range of the circuit cell. CMD region 118 is at a distance from CMD region 114 much greater than the distance in FIG. 4A. More particularly, as shown in FIG. 4B, CMD regions 114 and 118 are on opposite sides of active region 111$b$-1. For clarity of illustration, a CPODE structure above the edge active regions 111$b$-1 and 111$b$-2, as shown in FIG. 2B, is not shown in FIG. 4B.

Figure 4C:
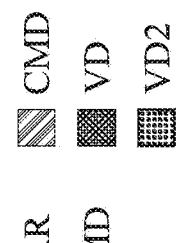
FIG. 4C illustrates a layout of an exemplary single-height circuit cell including an AR-jog structure, in accordance with some embodiments.
Figure 4C:
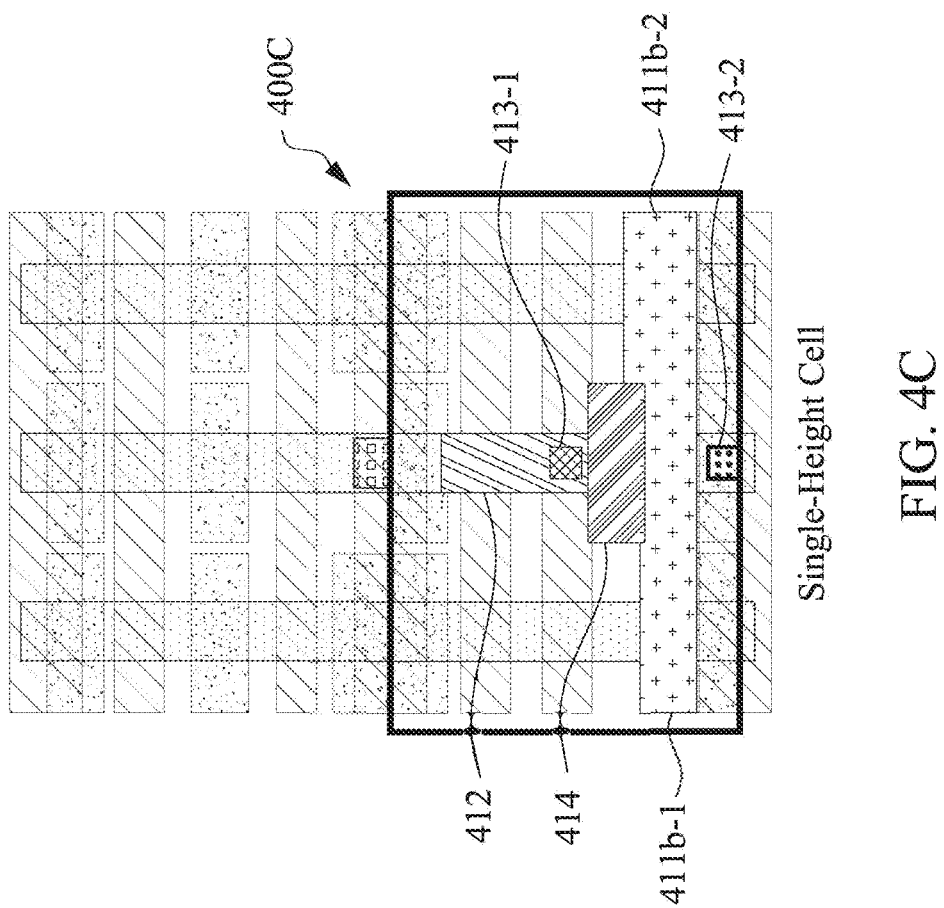
Figure 4C:

FIG. 4C illustrates a layout 400C of an exemplary single-height circuit cell including an AR-jog structure, in accordance with some embodiments. As shown in FIG. 4C, layout 400C of the single-height circuit cell includes active regions 411$b$-1 and 411$b$-2, an MD region 412, VDs 413-1 and 413-2, and a CMD region 414. These regions and VD 413-1 are similar to active regions 111$b$-1 and 111$b$-2, MD region 112, VD 113, and CMD region 114 as described above with reference to FIGS. 1A-1C and 2A-2F. VDs 413-1 and 413-2 are on opposite sides of both active region 411$b$-1 and CMD region 414 in the single-height circuit cell. Since VD 413-1 is coupled to a middle M0 region of a three-metal-routing cell, VD 413-2 is at an outward side of the circuit cell. In this embodiment, there is no room to accommodate another CMD region at the outward side of the circuit cell. A transistor terminal at VD 413-2 is a source of a transistor, which prevents the placement of a CMD region in an abutting cell next to VD 413-2. In this manner, two CMD regions would not be placed too close to each other. Therefore, a CMD pitch can be greater than a threshold of CMD pitch, as described above for CMD regions 114 and 118 with reference to FIG. 2D. This facilitates the manufacture of a circuit including layout 400C by the single-patterning and single-etching (1P1E) method. For clarity of illustration, a CPODE structure above the edge active regions 411$b$-1 and 411$b$-2, as shown in FIG. 2B, is not shown in FIG. 4C.

In some embodiments, the above exemplary semiconductor device, having the first, second, and third conductive regions and the first and second active regions, also includes a first via and a second via. The first via is coupled between the first conductive region and the third conductive region. The second via is coupled to a source of a transistor. The first and second vias are on opposite sides of the first active region.

For example, when a semiconductor device is implemented by the circuit cell including layout 400C, the semiconductor device includes active regions 411$b$-1 and 411$b$-2, MD region 412, VDs 413-1 and 413-2, and CMD region 414. Since these regions and VD 413-1 are similar to active regions 111$b$-1 and 111$b$-2, MD region 112, CMD region 114, and VD 113 in layout 200B (FIG. 2B), the semiconductor device implemented by the circuit cell including layout 400C has similar regions and via to the above semiconductor device implemented by the circuit cell including layout 200B, as described above with reference to FIG. 2B. Thus, as shown in FIG. 4C, the above semiconductor device implemented by the circuit cell including layout 400C includes VD 413-1 coupled between a wide M0 region (not shown in FIG. 4C) and MD region 412. In addition, the semiconductor device also includes VD 413-2 coupled to a source of a transistor, as described above with reference to FIG. 4C. VD 413-1 and 413-2 are within the single-height circuit cell of FIG. 4C and on opposite sides of active region 411$b$-1.

Figure 5A:
FIG. 5A illustrates a layout of an exemplary double-height circuit cell including two AR-jog structures, in accordance with some embodiments.

FIG. 5A illustrates a layout 500A of an exemplary double-height circuit cell including two AR-jog structures, in accordance with some embodiments. As shown in FIG. 5A, layout 500A of the double-height circuit cell includes active regions 111$b$-1 and 111$b$-2, MD region 112, VD 113, and CMD region 114 within an upper cell-height range of the circuit cell. These regions and via are described above with reference to FIGS. 1A-1C and 2A-2F. Layout 500A also includes active regions 511$b$-1 and 511$b$-2, MD region 512, VD 513, and CMD region 514 within a bottom cell-height range of the circuit cell. These regions and via are similar to those within the upper cell-height range but in a reversed direction on the Y axis. For clarity of illustration, CPODE structures above the edge active regions 111$b$-1 and 111$b$-2 and above the edge of active regions 511$b$-1 and 511$b$-2, as shown in FIG. 2B, are not shown in FIG. 5A.

In some embodiments, the above exemplary semiconductor device, having the first, second, and third conductive regions and the first and second active regions, also includes a fourth conductive region, a fifth conductive region, a sixth conductive region, a third active region, and a fourth active region. The fourth conductive region has the first width and extends along the first direction. The fifth conductive region has the second width and extends along the first direction. The third active region has the third width and extends along the first direction. The fourth active region has the fourth width and extends along the first direction. The sixth conductive region extends along the second direction and is electrically connected to the fourth conductive region. The third and fourth active regions are neighboring active regions.

For example, when a semiconductor device is implemented by the circuit cell including layout 500A, the semiconductor device includes active regions 111$b$-1 and 111$b$-2, MD region 112, VD 113, and CMD region 114. Since these regions and via are similar to the regions and via in layout 300A, the semiconductor device implemented by the circuit cell including layout 500A has similar regions and via to the above semiconductor device implemented by the circuit cell including layout 300A, as described above with reference to FIG. 3.

In addition, the above semiconductor device implemented by the circuit cell including layout 500A also includes a middle wide M0 region (i.e., a conductive region) coupled to VD 513 within the bottom cell-height range. The wide M0 region has a width of $W_{VM0}$ (e.g., 11 nm) and extends along the X-axis direction, such as a wide M0 region at the Second Wide M0 position in FIG. 1C. The semiconductor device also includes an M0 region above the wide M0 region (i.e., a conductive region), such as an M0 region corresponding to the Normal M0 position above the Second Wide M0 in FIG. 1C. The M0 region has a width of $W_{M0}$ (e.g., 10 nm) and extends along the X-axis direction.

The semiconductor device also includes small active region 511b-1 (i.e., an active region). Active region 511b-1 has a width of $W_{AR\_1}$ (e.g., 13.5 nm) and extends along the X-axis direction. The semiconductor device also includes active region 511b-2 (i.e., an active region). Active region 511b-2 has a width of $W_{AR\_2}$ (e.g., 18 nm) and extends along the X-axis direction. The semiconductor device also includes MD region 512 (i.e., a conductive region). MD region 512 extends along the Y-axis direction and is electrically connected to the wide M0 region through VD 513. The wide M0 region, the M0 region above the wide M0 region, MD region 512, active regions 511b-1 and 511b-2, and VD 513 are in the circuit cell including layout 500A. Active regions 511b-1 and 511b-2 are coupled together and therefore next to each other. Active regions 511b-1 and 511b-2 are abutting active regions. There are no other active regions between active regions 511b-1 and 511b-2. Active regions 511b-1 and 511b-2 are also considered to be neighboring active regions herein.

In some embodiments, in the above exemplary semiconductor device, having the first, second, third, fourth, fifth, and sixth conductive regions and the first, second, third, and fourth active regions, the third and sixth conductive regions are on opposite sides of the first active region. The third and sixth conductive regions are also on opposite sides of the third active region. For example, in the above semiconductor device implemented by the circuit cell including layout 500A, MD regions 112 and 512 are on opposite sides of active region 111b-1. MD regions 112 and 512 are also on opposite sides of active region 511b-1.

Figure 5B:
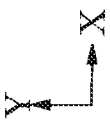
FIG. 5B illustrates a layout of another exemplary double-height circuit cell including two AR-jog structures, in accordance with some embodiments.

FIG. 5B illustrates a layout 500B of an exemplary double-height circuit cell including two AR-jog structures, in accordance with some embodiments. As shown in FIG. 5B, layout 500B of the double-height circuit cell includes active regions 111b-1 and 111b-2, MD region 112, VD 113, and CMD region 114 within an upper cell-height range of the circuit cell. These regions and via are similar to those within the upper cell-height range of layout 500A in the double-height circuit cell of FIG. 5A. Layout 500B also includes active regions 521b-1 and 521b-2, MD region 522, VDs 523-1 and 523-2, and CMD region 524 within a bottom cell-height range of the circuit cell. These regions and vias are similar to those in layout 400C, as described above with reference to FIG. 4C. For clarity of illustration, CPODE structures above the edge active regions 111b-1 and 111b-2 and above the edge of active regions 521b-1 and 521b-2, as shown in FIG. 2B, are not shown in FIG. 5B.

In some embodiments, the above exemplary semiconductor device, having the first, second, third, fourth, fifth, and sixth conductive regions and the first, second, third, and fourth active regions, also includes a first via, a second via, and a third via. The first via is coupled between the first conductive region and the third conductive region. The second via is coupled between the fourth conductive region and the sixth conductive region. The third via is coupled to a source of a transistor. The second and third vias are on opposite sides of the third active region.

For example, when a semiconductor device is implemented by the circuit cell including layout 500B, the semiconductor device includes active regions 111b-1 and 111b-2, MD region 112, VD 113, and CMD region 114. These regions and via are similar to the regions and via in the upper cell-height range of layout 500A. The above semiconductor device implemented by the circuit cell including layout 500B also includes active regions 521b-1 and 521b-2, MD region 522, VD 523-1, and CMD region 524. These regions and via are similar to the regions and vias in the bottom cell-height range of layout 500A, except in a reversed direction along the Y-axis. In other words, the semiconductor device implemented by the circuit cell including layout 500B also has similar regions and vias to the above semiconductor device implemented by the circuit cell including layout 500A. In addition, the semiconductor device implemented by the circuit cell including layout 500B also includes VD 523-2 similar to VD 413-2 in FIG. 4C.

Accordingly, the semiconductor device implemented by the circuit cell including layout 500B includes VD 113 coupled between the wide M0 region within the upper cell-height range and MD region 112. The semiconductor device also includes VD 523-1 coupled between the wide M0 region within the bottom cell-height range and MD region 522. The semiconductor device also includes VD 523-2 coupled to a source of a transistor, as described above with reference to FIG. 4C. VDs 113, 523-1, and 523-2 are within the double-height circuit cell of FIG. 5B. VDs 523-1 and 523-2 are on opposite sides of active region 521b-1.

Figure 5C:
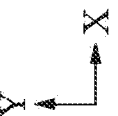
FIG. 5C illustrates a layout of another exemplary double-height circuit cell including two AR-jog structures, in accordance with some embodiments.

FIG. 5C illustrates a layout 500C of an exemplary double-height circuit cell including two AR-jog structures, in accordance with some embodiments. As shown in FIG. 5C, layout 500C of the double-height circuit cell includes active regions 521b-1 and 521b-2, MD region 522, VDs 523-1 and 523-2, and CMD region 524 within a bottom cell-height range of the circuit cell. These regions and vias are similar to those within the bottom cell-height range of layout 500B (FIG. 5B). Layout 500C also includes active regions 531b-1 and 531b-2, MD region 532, VD 533-1, and CMD region 534 within an upper cell-height range of the circuit cell. These regions and vias are similar to those within the upper cell-height range of layout 500B (FIG. 5B) but in a reversed direction along the Y axis. As shown in FIG. 5C, layout 500C also includes VD 533-2 at the upper boundary of the circuit cell. VD 533-2 is similar to VD 523-2 (FIG. 5C) or VD 413-2 (FIG. 4C). Since VD 533-1 is coupled to a middle M0 region of a three-metal-routing cell, VD 533-2 at an outward side of the circuit cell is a source of a transistor. For clarity of illustration, CPODE structures above the edge active regions 521b-1 and 521b-2 and above the edge of active regions 531b-1 and 531b-2, as shown in FIG. 2B, are not shown in FIG. 5C.

In some embodiments, in the above exemplary semiconductor device having the first, second, third, fourth, fifth, and sixth conductive regions, the first, second, third, and fourth active regions, and the first, second, and third vias, the transistor is a first transistor. The exemplary semiconductor device also includes a fourth via coupled to a source of a second transistor. The first and fourth vias are on opposite sides of the first active region.

For example, when a semiconductor device is implemented by the circuit cell including layout 500C, the semiconductor device includes active regions 521*b*-1, 521*b*-2, MD region 522, VDs 523-1 and 523-2, and CMD region 524. These regions and vias are similar to the regions and vias in the bottom cell-height range of layout 500B. The semiconductor device implemented by the circuit cell including layout 500C also includes active regions 531*b*-1 and 531*b*-2, MD region 532, VD 533-1, and CMD region 534. These regions and via are similar to the regions and via in the upper cell-height range of layout 500B, except in a reversed direction along the Y-axis. In other words, the semiconductor device implemented by the circuit cell including layout 500C has similar regions and vias to the above semiconductor device implemented by the circuit cell including layout 500B. In addition, the semiconductor device implemented by the circuit cell including layout 500C also includes VD 533-2 similar to VD 523-2 coupled to a source of a transistor.

Accordingly, in the semiconductor device implemented by the circuit cell including layout 500C, VD 523-2 is connected to the source of a first transistor. VD 533-2 is coupled to the source of a second transistor. VDs 533-1 and 533-2 are on opposite sides of active region 531*b*-1 (FIG. 5C).

FIG. 6A is a flowchart of an exemplary method 600 performed by a computer for determining a width of an active region in a circuit cell stored in a memory, in accordance with some embodiments. Method 600 may be practiced by a computer including a processor and a memory storing instructions and data of the circuit cell. The processor may be configured to execute the instructions to perform method 600.

As shown in FIG. 6A, method 600 includes obtaining, from the memory circuit, a first width for a first conductive region in the circuit cell, a first width for the active region, a differential width for the active region, and a space between the active region and a second conductive region in the circuit cell (step 610); calculating a first parameter based on the first width for the first conductive region (step 620); calculating a second parameter based on the first width for the active region, the differential width for the active region, and the space between the active region and a second conductive region (step 630); determining whether the first parameter is less than the second parameter (step 640); calculating a third parameter based on a second width for the first conductive region and a fourth parameter based on the differential width for the active region in response to a determination that the first parameter is less than the second parameter, the second width for the first conductive region greater than the first width for the first conductive region (step 650); determining whether the third parameter is equal to or greater than the fourth parameter (step 660); determining the second width for the first conductive region as a width of the first conductive region in response to a determination that the third parameter is equal to or greater than the fourth parameter (step 670); determining that a width of the active region equals the first width for the active region minus the differential width for the active region (step 680); and inserting an isolating region between the second conductive region and a third conductive region (step 690).

Step 610 includes obtaining, from the memory circuit, a first width for a first conductive region in the circuit cell, a first width for the active region, a differential width for the active region, and a space between the active region and a second conductive region in the circuit cell. For example and with reference to the exemplary dimensions in Table I, the processor of the computer is configured to execute the instructions to read, from the memory of the computer, a height ($H_C$) of the circuit cell (e.g., a cell height=92 nm in Table I (above), i.e., $H_C$=92 nm), a width ($W_{M0}$) for a middle M0 region (e.g., M0 width=10 nm in Table I, i.e., $W_{M0}$=10 nm), a space ($SPC_{NP}$) between n-type and p-type MOS transistors (e.g., NP space=28 nm in Table I, i.e., $SPC_{NP}$=28 nm), a width ($W_{AR}$) for an active region (e.g., AR width=18 nm in Table I, i.e., $W_{AR}$=18 nm), a differential width ($W_{AR\text{-}jog}$) for an active region (e.g., AR jog=4.5 nm in Table I, i.e., $W_{AR\text{-}jog}$=4.5 nm), a space ($SPC_{MD\text{-}AR}$) between the active region and an MD region (e.g., MD to AR space=13 nm in Table I, i.e., $SPC_{MD\text{-}AR}$=13 nm), an enclosure (ENC$_{VD/MD}$) of a VD by the MD region (e.g., VD/MD enclosure=1 nm in Table I, i.e., $ENC_{VD/MD}$=1 nm), a width ($W_{VD}$) of VD (e.g., VD width=10 nm in Table I, i.e., $W_{VD}$=10 nm), and an enclosure ($ENC_{VD/M0}$) of the VD by the middle M0 region (e.g., VD/M0 enclosure=0 in Table I, i.e., $ENC_{VD/M0}$=0 nm).

Step 620 includes calculating a first parameter based on the first width for the first conductive region. For example, the processor is configured to execute the instructions to calculate a first parameter $H_{HC}$ based on the height of the circuit cell ($H_C$=92 nm) and the width for the middle M0 region ($W_{M0}$=10 nm) in accordance with: $H_{HC}$=0.5×($H_C$+$W_{M0}$). For example, when $H_C$=92 and $W_{M0}$=10, $H_{HC}$=0.5×(92+10)=51 nm.

Step 630 includes calculating a second parameter based on the first width for the active region and the space between the active region and a second conductive region. For example, the processor is configured to execute the instructions to calculate a second parameter $SH_{HC}$ based on the space between n-type and p-type MOS transistors ($SPC_{NP}$=28 nm), the width for the active region ($W_{AR}$=18 nm), the differential width for the active region ($W_{AR\text{-}jog}$=4.5 nm), the space between the active region and the MD region ($SPC_{MD\text{-}AR}$=13 nm), the enclosure of the VD by the MD region ($ENC_{VD/MD}$=1 nm), the width of VD ($W_{VD}$=10 nm), and the enclosure of the VD by the middle M0 region ($ENC_{VD/M0}$=0 nm) in accordance with: $SH_{HC}$=0.5×$SPC_{NP}$+$W_{AR}$+$SPC_{MD\text{-}AR}$+$ENC_{VD/MD}$+$W_{VD}$+$ENC_{VD/M0}$. For example, when $SPC_{NP}$=28 nm, $W_{AR}$=18 nm, $W_{AR\text{-}jog}$=4.5 nm, $SPC_{MD\text{-}AR}$=13 nm, $ENC_{VD/MD}$=1 nm, $W_{VD}$=10 nm, and $ENC_{VD/M0}$=0 nm, $SH_{HC}$=0.5×28+18−0+13+1+10+0=56.

Step 640 includes determining whether the first parameter is less than the second parameter. For example, the processor is configured to execute the instructions to determine whether $H_{HC}$ is less than $SH_{HC}$. For example, when $H_{HC}$=51 nm (step 620) and $SH_{HC}$=56 nm (step 630), the processor is configured to determine that $H_{HC}$ is less than $SH_{HC}$, i.e., $H_{HC}$<$SH_{HC}$.

As another example, if $SPC_{MD\text{-}AR}$=8 nm and $SH_{HC}$=51 nm based on the equation in step 630, the processor is configured to determine that $H_{HC}$ is not less than $SH_{HC}$, i.e., $H_{HC}$>=$SH_{HC}$. In some embodiments, the processor is configured to execute the instructions to determine that a small active region is not applicable to the circuit cell.

Step 650 includes calculating a third parameter based on a second width for the first conductive region and a fourth parameter based on the differential width for the active region in response to a determination that the first parameter is less than the second parameter. The second width for the first conductive region is greater than the first width for the first conductive region. For example, the processor is configured to execute the instructions to calculate a third parameter $H'_{HC}$ based on the height of the circuit cell ($H_C$=92 nm) and a width for a wide middle M0 region (e.g., Wide M0 width=11 nm in Table I, i.e., $W_{VM0}$=11) in accordance with $H'_{HC}$=0.5×($H_C$+$W_{VM0}$). For example, when $H_C$=92 and $W_{WM0}$=11, $H'_{HC}$=0.5×(92+11)=51.5 nm.

The processor is also configured to execute the instructions to calculate a fourth parameter $SH'_{HC}$ based on the space between n-type and p-type MOS transistors ($SPC_{NP}$=28 nm), the width for the active region ($W_{AR}$=18 nm), the differential width for the active region ($W_{AR-jog}$=4.5 nm), the space between the active region and the MD region ($SPC_{MD-AR}$=13 nm), the enclosure of the VD by the MD region ($ENC_{VD/MD}$=1 nm), the width of VD ($W_{VD}$=10 nm), and the enclosure of the VD by the middle M0 region ($ENC_{VD/M0}$=0 nm) in accordance with: $SH'_{HC}$=0.5×$SPC_{NP}$+$W_{AR}$-$W_{AR-jog}$+$SPC_{MD-AR}$+$ENC_{VD/MD}$+$W_{VD}$+$ENC_{VD/M0}$, as described below with reference to FIG. 6B. For example, when $SPC_{NP}$=28 nm, $W_{AR}$=18 nm, $W_{AR-jog}$=4.5 nm, $SPC_{MD-AR}$=13 nm, $ENC_{VD/MD}$=1 nm, $W_{VD}$=10 nm, and $ENC_{VD/M0}$=0 nm, $SH'_{HC}$=0.5×28+18-4.5+13+1+10+0=51.5.

Step 660 includes determining whether the third parameter is equal to or greater than the fourth parameter. For example, the processor is configured to execute the instructions to determine whether $H'_{HC}$ is equal to or greater than $SH'_{HC}$. For example, when $H'_{HC}$=51.5 nm (step 650) and $SH'_{HC}$=51.5 nm (step 650), the processor is configured to determine that $H'_{HC}$ is equal to $SH'_{HC}$, i.e., $H'_{HC}$=$SH'_{HC}$.

Step 670 includes determining the second width for the first conductive region as a width of the first conductive region in response to a determination that the third parameter is equal to or greater than the fourth parameter. For example, the processor is configured to execute the instructions to determine that $W_{VM0}$ (11 nm) is the width of the middle M0 region in response to a determination that $H'_{HC}$ is equal to $SH'_{HC}$, i.e., $H'_{HC}$=$SH'_{HC}$. That is, the middle M0 region has a wider width than other M0 regions and is, for example, wide M0 region 117 in FIG. 3.

Step 680 includes determining that a width of the active region equals the first width for the active region minus the differential width for the active region. For example, the processor is configured to execute the instructions to determine that a width ($W_{AR-111b-1}$) of active region 111b-1 in FIG. 3 equals the width for the active region ($W_{AR}$=18 nm) minus the differential width for the active region ($W_{AR-jog}$=4.5 nm). For example, when $W_{AR}$=18 nm (step 610) and $W_{AR-jog}$=4.5 nm (step 650), $W_{AR-111b-1}$=$W_{AR}$-$W_{AR-jog}$=18-4.5=13.5 nm.

Step 690 includes inserting an isolating region between the second conductive region and a third conductive region. For example, the processor is configured to execute the instructions to insert CMD regions 114 between MD regions 112 and 116 in FIG. 2C after the processor determines that a length of MD region 112 is equal to or greater than a minimum MD length (e.g., min. MD length=23 nm in Table I).

In some embodiments, before steps 680 and 690, method 600 further includes determining whether the active region is on a critical path of the circuit cell. For example, before performing steps 680 and 690, the processor is configured to execute the instructions to determine whether an active region is on a critical path of the circuit cell. In response to a determination that the active region is not on the critical path of the circuit cell, the processor is configured to perform steps 680 and 690 as described above. In response to a determination that the active region is on the critical path of the circuit cell, the processor may be configured to select other active regions for performing steps 680 and 690. Alternatively, in response to the determination that the active region is on the critical path of the circuit cell, the processor may be configured to determine that a small active region is not applicable to the circuit cell.

Figure 6B:
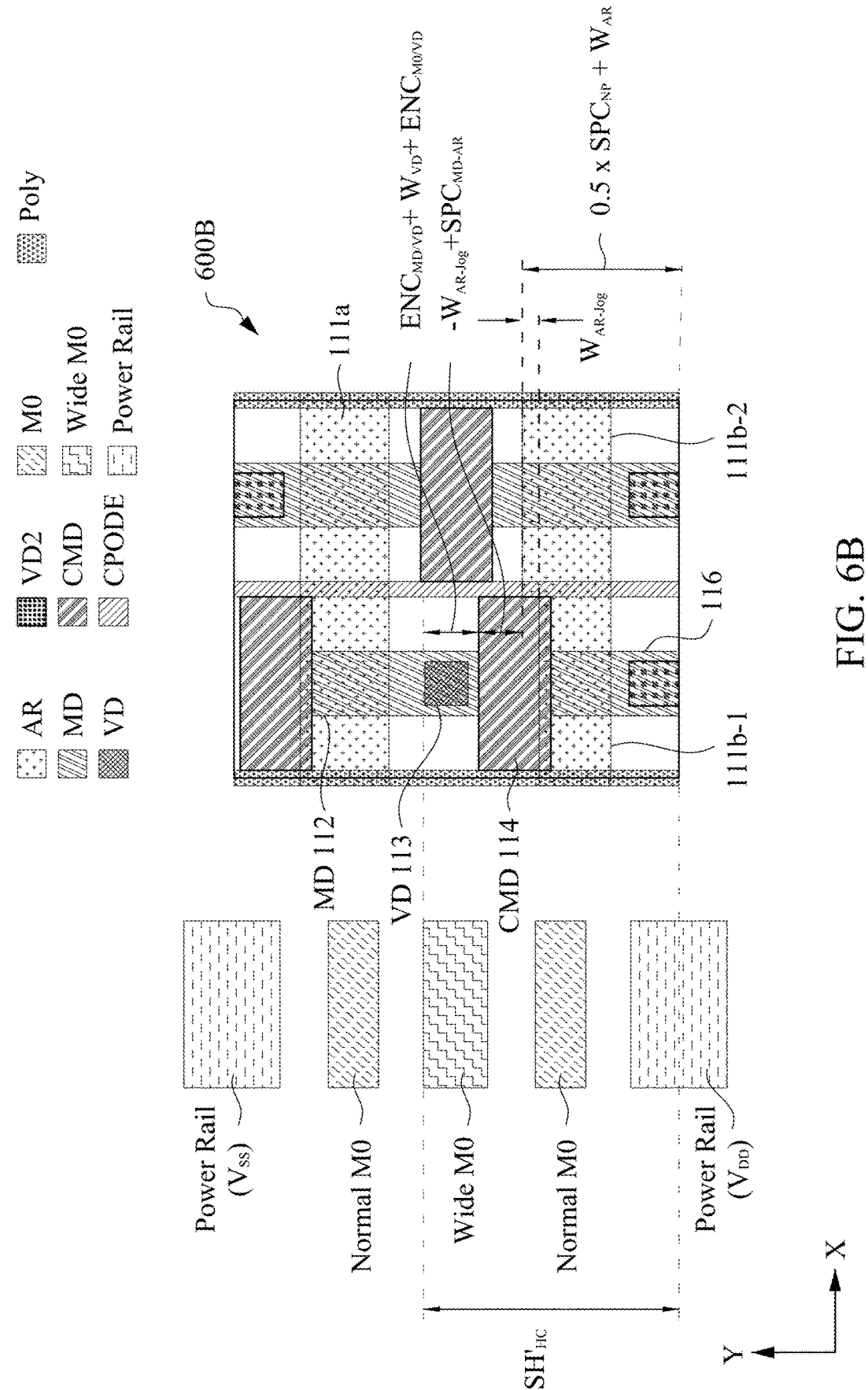
FIG. 6B illustrates exemplary geometry of a layout corresponding to the exemplary method illustrated in FIG. 6A, in accordance with some embodiments.

FIG. 6B illustrates the geometry of a layout 600B for the exemplary method 600 illustrated in FIG. 6A, in accordance with some embodiments. Layout 600B corresponds to layout 300A in FIG. 3 and region 115 in FIG. 1C. As shown in FIG. 6B, layout 600B includes active regions 111a, 111b-1, and 111b-2, MD regions 112 and 116, VD 113, and CMD region 114. The regions and via correspond to those of the same reference numbers in this disclosure.

The fourth parameter $SH'_{HC}$ in step 650 of method 600 is a height in the X-Y plane (i.e., a length along the Y-axis direction) as indicated in FIG. 6B. The height $SH'_{HC}$ includes first, second, and third partial heights. The first partial height equals half of the space between n-type and p-type MOS transistors plus the width of active region 111b-2, i.e., 0.5×$SPC_{NP}$+$W_{AR}$, as illustrated in FIG. 6B. The second partial height equals a space between MD region 112 and active region 111b-1 minus the width of AR jog, i.e., -$W_{AR-jog}$+$SPC_{MD-AR}$, as illustrated in FIG. 6B. The third partial height equals an enclosure of VD 113 by MD region 112 plus a width of VD 113 plus an enclosure of VD 113 by wide M0 region 117 (FIG. 3), i.e., $ENC_{VD/MD}$+$W_{VD}$+$ENC_{VD/M0}$, as illustrated in FIG. 6B.

Figure 7A:
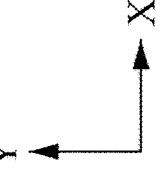
FIG. 7A illustrates exemplary geometry of the back-end-of-line (BEOL) for an exemplary circuit cell, in accordance with some embodiments.
Figure 7A:
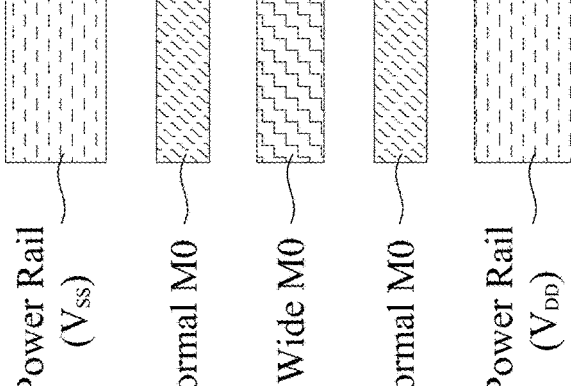

FIG. 7A illustrates exemplary geometry of the back-end-of-line (BEOL) for an exemplary circuit cell 700A, in accordance with some embodiments. Table II below lists a plurality of exemplary region sizes of circuit cell 700A in a three-metal-routing circuit cell of a 2 nm process. As illustrated in FIG. 7A and Table II, an enclosure of a VD by an M0 region ranges from 0 to 5 nm, i.e., Enclosure VD/M0=0-5 nm. A width of an M0 region is equal to or greater than one tenth of a cell height, i.e., M0 width>=0.1× Cell height. The width of the M0 region is equal to or less than two tenths of the cell height, i.e., M0 width<=0.2×Cell height. An M0 space is equal to or greater than one tenth of the cell height, i.e., M0 space>=0.1×Cell height. The M0 space is equal to or less than two tenths of the cell height, i.e., M0 width<=0.2×Cell height. A width of a middle wide M0 region is equal to or greater than the width of the M0 region, i.e., wide M0 width>=M0 width.

TABLE II

| Item | Relation | Range (nm) |
|---|---|---|
| Enclosure VD/M0 | | 0~5 |
| M0 width | ≥0.1 × Cell height; ≤0.2 × Cell height | |
| M0 space | ≥0.1 × Cell height; ≤0.2 × Cell height | |
| Wide M0 width | ≥M0 width (must between two power lines) | |

Figure 7B:
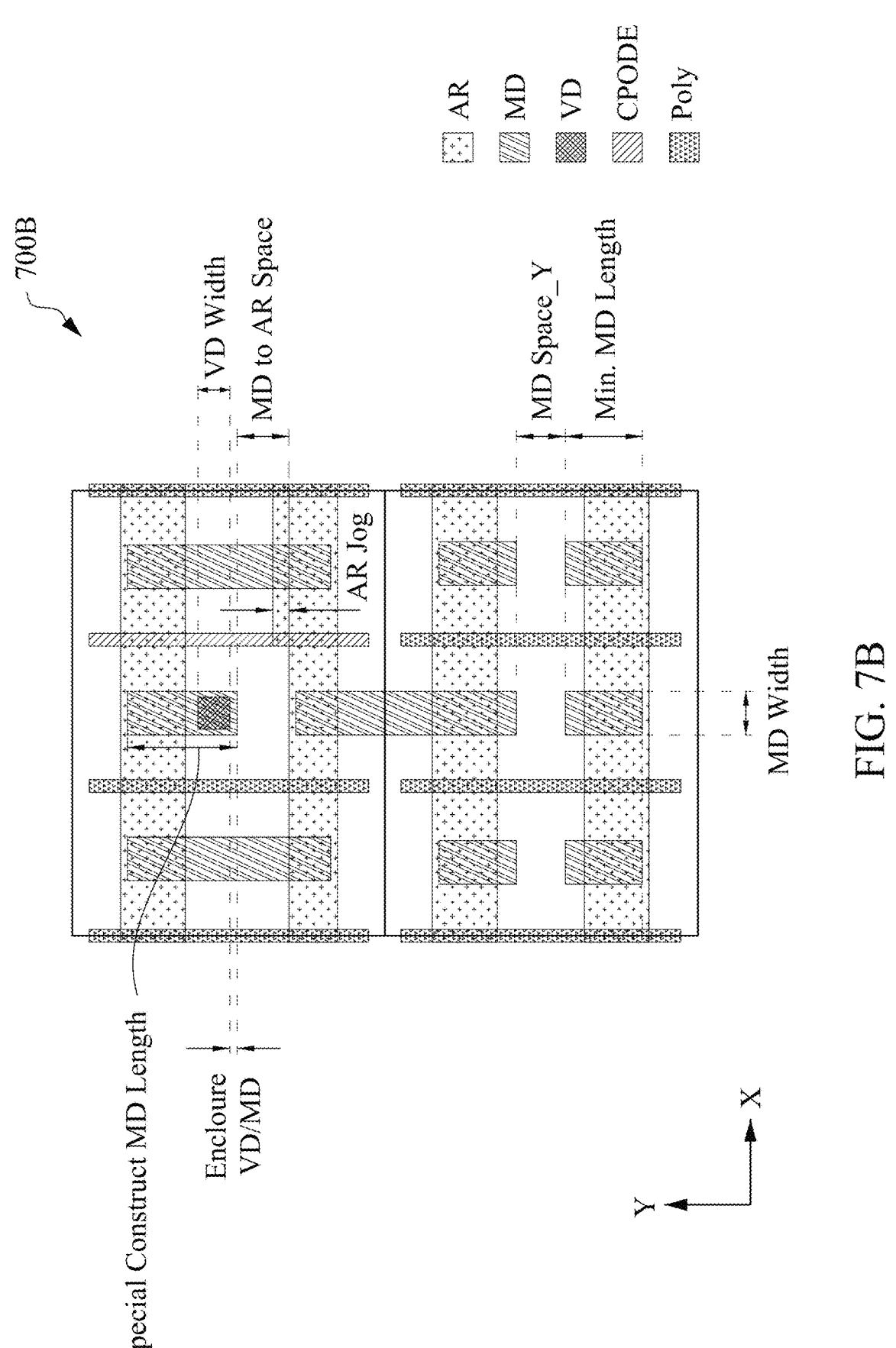
FIG. 7B illustrates exemplary geometry of the middle-of-line (MEOL) for an exemplary circuit cell, in accordance with some embodiments.

FIG. 7B illustrates exemplary geometry of the middle-of-line (MEOL) for an exemplary circuit cell 700B, in accordance with some embodiments. Table III below lists a plurality of exemplary region sizes of circuit cell 700B in a three-metal-routing circuit cell of a 2 nm process. As illustrated in FIG. 7B and Table III, a space between MD and active regions ranges from 5 to 15 nm, i.e., MD to AR space=5-15 nm. A width of an MD region is equal to or greater than a width of a VD, i.e., MD width>=VD width. The width of the MD region is equal to or less than half of a poly pitch size, i.e., MD width<=0.5×PO pitch. An MD space along the Y-axis direction ranges from 10 to 40 nm, i.e., MD space_Y=10-40 nm.

19

TABLE III

| Item | Relation | Range (nm) |
|---|---|---|
| MD to AR space | | 5~15 |
| MD width | ≥VD width; ≤0.5 × PO pitch | |
| MD space_Y | | 10~40 |
| Min. MD length | ≥Cell height − 1.5 × MD space_Y − 0.5 × Enclosure VD/MD | |
| Special construct MD length | ≥Min. MD length + VD width | |
| VD width | | 5~15 |
| Enclosure VD/MD | | 0~5 |

A minimum MD length is equal to or greater than a cell height minus one and a half of the MD space along the Y-axis direction minus half of an enclosure of a VD by an MD region, i.e., Min. MD length>=Cell height−1.5×MD space_Y−0.5× Enclosure VD/MD. A special construct MD length is equal to or greater than the minimum MD length plus a VD width, i.e., Special construct MD length>=Min. MD length+VD width. The VD width ranges from 5 to 15 nm, i.e., VD width=5-15 nm. The enclosure of the VD by the MD region ranges from 0 to 5 nm, i.e., Enclosure VD/MD=0-5 nm.

Figure 7C:
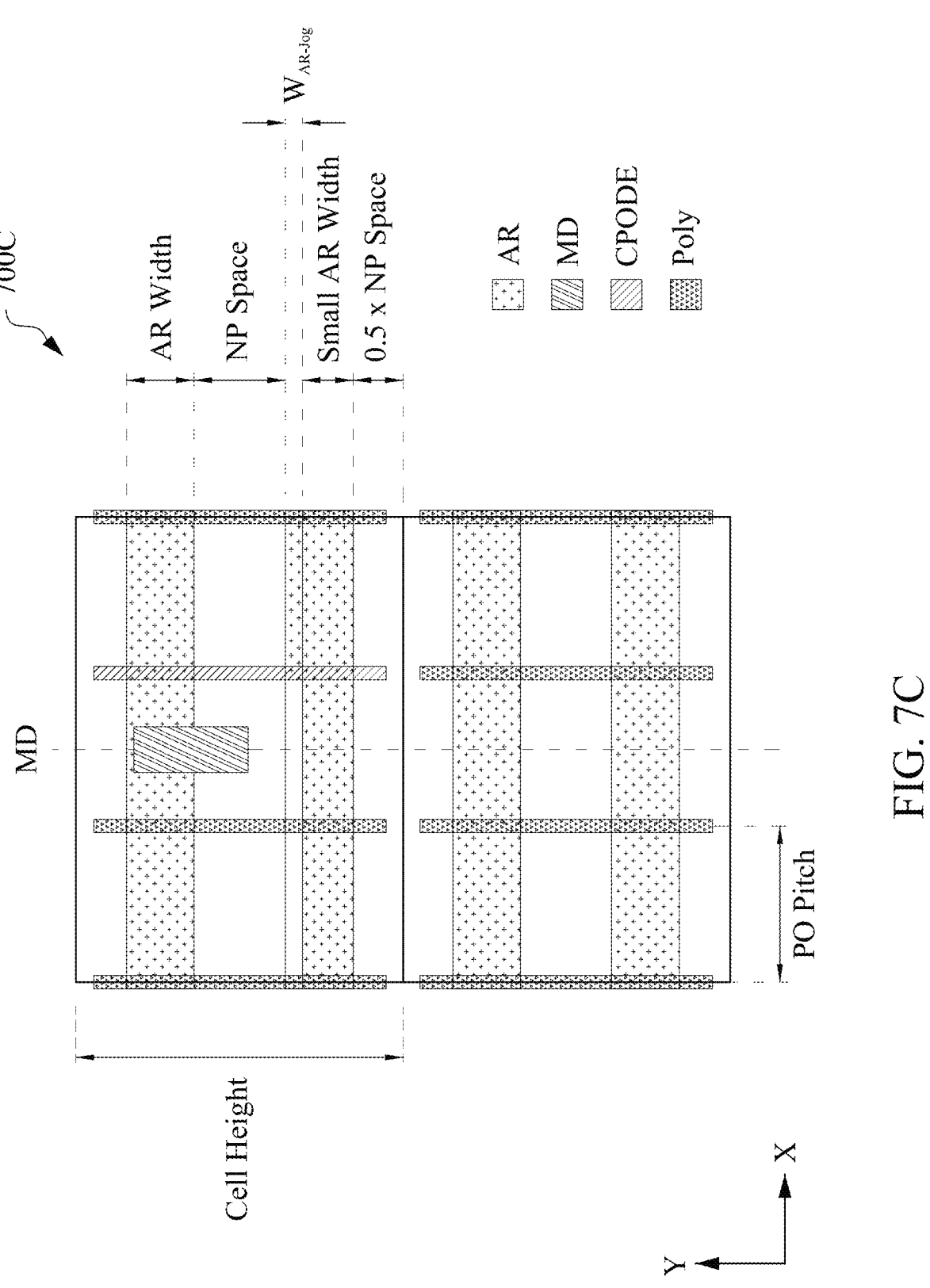
FIG. 7C illustrates exemplary geometry of the front-end-of-line (FEOL) for an exemplary circuit cell, in accordance with some embodiments.

FIG. 7C illustrates exemplary geometry of the front-end-of-line (FEOL) for an exemplary circuit cell 700C, in accordance with some embodiments. Table IV below lists a plurality of exemplary region sizes of circuit cell 700C in a three-metal-routing circuit cell of a 2 nm process. As illustrated in FIG. 7C, a cell height ranges from 80 to 110 nm, i.e., Cell height=80-110 nm. A poly pitch size ranges from 40 to 55 nm, i.e., PO pitch=40-55 nm. A space between n-type and p-type MOS transistors ranges from 20 to 35 nm, i.e., NP space=20-35 nm. A width of an active region is equal to or less than a cell height minus two spaces between n-type and p-type MOS transistors, i.e., AR width<=Cell height−2×NP space. A width of a small active region is equal to the width of the active region minus a width of an AR jog, i.e., Small AR width=AR width-W$_{AR-jog}$. The width of the AR jog is equal to or greater than 0 nm. The width of the AR jog is equal to or less than half of an AR pitch size, i.e., W$_{AR-jog}$>=0 and W$_{AR-jog}$<=0.5×AR pitch.

TABLE IV

| Item | Relation | Range (nm) |
|---|---|---|
| Cell height | | 80~110 |
| PO pitch | | 40~55 |
| NP space | | 20~35 |
| AR width | ≤Cell height − 2 × NP space | |
| Small AR width | AR width − W$_{AR-jog}$ | |
| W$_{AR-jog}$ | | ≥0; ≤0.5 × AR pitch |

FIG. 8 is a flowchart of an exemplary method 800 for fabricating an integrated circuit, in accordance with some embodiments. Method 800 includes forming a first active region in a first layer (step 802); forming a second active region in the first layer, the first and second active regions being neighboring active regions (step 804); forming a third active region in the first layer (step 806); forming an isolating region in a second layer (step 808); forming a first conductive region in the second layer (step 810); fabricating a via coupled to the first conductive region and above the second layer (step 812); forming a second conductive region in a third layer and coupled to the via (step 814); and forming a third conductive region in the third layer (step 816).

Step 802 includes forming a first active region in a first layer. The first active region has a first width and extends along a first direction. For example, semiconductor manufacturing equipment forms active region 111b-1 (FIG. 2B, 2C, or 1C) in an active region layer of three-metal-routing flip-flop circuit 200A (FIG. 2A). Active region 111b-1 extends along the X-axis direction and has the width W$_{AR\_1}$. In an exemplary embodiment, the width W$_{AR\_1}$ of active region 111b-1 is 13.5 nm, i.e., W$_{AR\_1}$=13.5 nm.

More specifically, forming the first active region in the first layer of step 802 includes fabricating source and drain regions of a plurality of transistors in a first well. For example, the semiconductor manufacturing equipment fabricates the first well comprising one or more p-type dopants. The p-dopants include boron, aluminum, or other suitable p-type dopants. In some embodiments, the semiconductor manufacturing equipment fabricates the first well by forming an epi-layer over a region of a substrate for the first well. The semiconductor manufacturing equipment may also dope the epi-layer by adding one or more dopants during an epitaxial process. In some embodiments, the semiconductor manufacturing equipment may dope the epi-layer by ion implantation after the epi-layer is formed. In some embodiments, the semiconductor manufacturing equipment fabricates the first well by doping the substrate. For example, the semiconductor manufacturing equipment dopes the substrate by ion implantation. In some embodiments, the first well comprises an n-type dopant. The n-type dopant may be phosphorus, arsenic, or another suitable n-type dopant.

In an exemplary embodiment, the semiconductor manufacturing equipment performs step 802 to form active region 111b-1, EPI region 220, HF regions, and other similar regions, as shown in FIG. 2C.

Step 804 includes forming a second active region in the first layer. The first and second active regions are neighboring active regions. The second active region has a second width and extends along the first direction. The first width is less than the second width. For example, the semiconductor manufacturing equipment forms active region 111a (FIG. 2B or 2C) in the active region layer of three-metal-routing flip-flop circuit 200A (FIG. 2A). Active regions 111b-1 and 111a are neighboring active regions. Active region 111a extends along the X-axis direction and has the width W$_{AR\_2}$. In an exemplary embodiment, the width W$_{AR\_2}$ of active region 111a is 18 nm, i.e., W$_{AR\_2=18}$ nm. The width W$_{AR\_1}$ of active region 111b-1 (e.g., 13.5 nm) is less than the width W$_{AR\_2}$ of active region 111a (e.g., 18 nm).

More specifically, forming the second active region in the first layer of step 804 includes fabricating source and drain regions of a plurality of transistors in a second well. In some embodiments, the semiconductor manufacturing equipment performs steps 802 and 804 concurrently by one or more of the processes and techniques described above with reference to step 802.

In an exemplary embodiment, the semiconductor manufacturing equipment performs step 804 to form active region 111a, EPI region 210, HF regions, and other similar regions, as shown in FIG. 2C.

Step 806 includes forming a third active region in the first layer. The third active region has the second width, extends along the first direction, and is coupled to the first active region. For example, the semiconductor manufacturing equipment forms active region 111b-2 (FIG. 2B) in the active region layer of three-metal-routing flip-flop circuit 200A (FIG. 2A). Active region 111b-2 has the second width W$_{AR\_2}$ and extends along the X-axis direction. Active region 111b-2 is coupled to active region 111b-1 (FIG. 2B). Active regions 111*b*-1 and 111*b*-2 are abutting active regions. Active regions 111*b*-1 and 111*b*-2 are also considered to be neighboring active regions herein. In an exemplary embodiment, the width $W_{AR\_2}$ of active region 111*b*-2 is 18 nm, i.e., $W_{AR\_2}$=18 nm. The width $W_{AR\_1}$ of active region 111*b*-1 (e.g., 13.5 nm) is less than the width $W_{AR\_2}$ of active region 111*b*-2 (e.g., 18 nm).

More specifically, in some embodiments, the first active region formed in step 802 includes the entire active region 111*b* (FIG. 2B) having two widths, including active region 111*b*-1 having the width $W_{AR\_1}$ and active region 111*b*-2 having the $W_{AR\_2}$. In these embodiments, forming the third active region in the first layer of step 806 includes separating active region 111*b* into two active regions 111*b*-1 and 111*b*-2 by a continuous poly on oxide definition edge (CPODE) structure. For example, the semiconductor manufacturing equipment fabricates a dummy gate structure above the edge between active regions 111*b*-1 and 111*b*-2. The CPODE structure on the edge between active regions 111*b*-1 and 111*b*-2 helps to avoid leakage between neighboring transistors in the two active regions and provides additional reliability during manufacturing. Active region 111*b*-1 having the smaller width (i.e., $W_{AR\_1}$) remains as the first active region in step 802. Active region 111*b*-2 having a normal width (i.e., $W_{AR\_2}$) is formed as the third active region in step 806.

In some embodiments, step 806 includes separating the first well in step 802 into two well regions. One of the two well regions remains as the first active region, i.e., active region 111*b*-1, in step 802. The other of the two well regions forms the third active region, i.e., active region 111*b*-2. For example, the semiconductor manufacturing equipment removes the dummy gate structure by one or more etching processes to form a trench, a bottom surface of the trench being below a bottom surface of the two well regions, and fills the trench with dielectric material, e.g., SiN, to be the CPODE structure. As a result, the first well in step 802 is separated into the two well regions. The one well region having a smaller width (i.e., $W_{AR\_1}$) remains as active regions 111*b*-1. The other well region having a normal width (i.e., $W_{AR\_2}$) forms active regions 111*b*-2.

In some embodiments, the semiconductor manufacturing equipment performs steps 802 and 806 concurrently by one or more of the processes and techniques described above with reference to step 802. In some embodiments, the semiconductor manufacturing equipment performs steps 802, 804, and 806 concurrently by one or more of the processes and techniques described above with reference to step 802.

In an exemplary embodiment, the semiconductor manufacturing equipment performs step 806 to form active region 111*b*-2 (FIG. 2B), other active regions, other EPI regions, other HF regions.

Step 808 includes forming an isolating region in a second layer. The second layer is above the first layer. For example, the semiconductor manufacturing equipment deposits and forms a layer of conductive material above EPI regions 210 and 220 (FIG. 2C), active regions 111*b*-1 and 111*a* (FIG. 2C), and other EPI regions and active regions to form MD regions. The conductive materials of these MD regions may include one or more of copper (Cu), silver (Ag), tungsten (W), titanium (Ti), nickel (Ni), tin (Sn), aluminum (Al), or other metal or material suitable for providing a low resistance electrical connection between integrated circuit structure elements, e.g., a material having a resistance level below a predetermined threshold corresponding to one or more tolerance levels of a resistance-based effect on circuit performance.

The semiconductor manufacturing equipment also etches one or more regions in the layer of conductive material at the positions of CMD region 114 and other CMD regions according to a CMD pattern. The semiconductor manufacturing equipment then fills in non-conductive material or by leaving the etched space empty to form CMD region 114 and other CMD regions. As a result, CMD region 114 is an isolating region. In some embodiments, the isolation material includes one or more dielectric materials, such as silicon dioxide and silicon oxynitride.

Step 810 includes forming a first conductive region in the second layer. The first conductive region extends along a second direction. The second direction is different from the first direction. For example, the semiconductor manufacturing equipment forms MD regions, including MD regions 112 and 116 (FIG. 2C) in the layer of conductive material deposited in step 808 above EPI regions 210 and 220 (FIG. 2C), active regions 111*b*-1 and 111*a* (FIG. 2C), by an etching process according to an MD pattern. The layer of conductive material is an MD layer of three-metal-routing flip-flop circuit 200A (FIG. 2A). MD regions 112 and 116 in the MD layer are conductive regions and extend along the Y-axis direction (FIGS. 2B and 2C). The Y-axis direction is different from the X-axis direction (FIG. 2B).

More specifically, forming the first conductive region in the second layer (step 810) includes forming a plurality of contacts above EPI regions 210 and 220 (FIG. 2C), active regions 111*b*-1 and 111*a* (FIG. 2C), and other EPI regions and active regions. The plurality of contacts are source and drain terminals of the plurality of transistors in the integrated circuit. The source and drain terminals of the transistors are therefore extended or electrically connected along these MD regions.

In some embodiments, step 810 further includes forming a plurality of gate regions of the transistors. The gate regions are formed between the drain regions and the source regions of the transistors. In some embodiments, the gate regions are over the first and second wells and the substrate. In some embodiments, fabricating the gate regions of step 810 includes performing one or more deposition processes to form one or more dielectric material layers. The deposition process may include a chemical vapor deposition (CVD), a plasma-enhanced CVD (PECVD), an atomic layer deposition (ALD), or other processes suitable for depositing one or more material layers. In some embodiments, fabricating the gate regions of step 810 includes performing one or more deposition processes to form one or more conductive material layers. In some embodiments, fabricating the gate regions includes forming gate electrodes or dummy gate electrodes. In some embodiments, fabricating the gate regions includes depositing or growing at least one dielectric layer, e.g., gate dielectric. In some embodiments, the semiconductor manufacturing equipment forms the gate electrodes using a doped or non-doped polycrystalline silicon (or polysilicon). In some embodiments, the semiconductor manufacturing equipment forms the gate electrodes containing a metal, such as Al, Cu, W, Ti, Ta, TiN, TaN, NiSi, CoSi, other suitable conductive materials, or combinations thereof.

Step 812 includes forming a via coupled to the first conductive region and above the second layer. The via has a third width. For example, the semiconductor manufacturing equipment forms VD 113 (FIG. 2C) coupled to MD region 112 (FIG. 2C) and between the MD and M0 layers. More specifically, after the semiconductor manufacturing equipment forms MD regions 112 and 116, CMD region 114, other MD regions, and other CMD regions in the MD layer, the semiconductor manufacturing equipment deposits a layer of an intra-metal dielectric (IMD) (i.e., an insulator) above the MD layer. The semiconductor manufacturing equipment also forms a via opening at the space of VD 113 (FIG. 2C) and other via openings in the layer of the IMD by, e.g., photolithography and a dry IMD etching process. The semiconductor manufacturing equipment also fills in the via openings by, e.g., ionized metal plasma (MP) sputtering to form VD 113 (FIG. 2C) and other VDs. VD 113 is coupled to the MD region 112 and between the MD and M0 layers. The M0 layer is above the MD layer. VD 113 has a width of $W_{VD}$. In an exemplary embodiment, the width of $W_{VD}$ is 10 nm, i.e., $W_{VD}$=10 nm.

Step 814 includes forming a second conductive region in a third layer and coupled to the via. The third layer is above the second layer. The via is coupled between the first conductive region in the second layer and the second conductive region in the third layer. The second conductive region has a fourth width and extends along the first direction. The third width is equal to or less than the fourth width. For example, the semiconductor manufacturing equipment forms a plurality of conductive regions including wide M0 region 117 (FIG. 2C or 2D) and other M0 regions in an M0 metal layer of three-metal-routing flip-flop circuit 200A (FIG. 2A). Wide M0 region 117 is a conductive region and coupled to VD 113. As a result, MD region 112 in the MD layer is electrically connected to wide M0 region 117 in the M0 layer by VD 113. Wide M0 region 117 has a width of $W_{VM0}$ and extends along the X-axis direction. In an exemplary embodiment, the width of wide M0 region 117 is 11 nm, i.e., $W_{WM0}$=11 nm. The width $W_{VD}$ (e.g., 10 nm) of VD 113 is less than the width $W_{VM0}$ (e.g., 11 nm) of wide M0 region 117.

In some embodiments, the plurality of conductive regions include conductive materials, such as one or more of polysilicon, copper (Cu), silver (Ag), tungsten (W), titanium (Ti), nickel (Ni), tin (Sn), aluminum (Al) or another metal or material suitable for providing a low resistance electrical connection between integrated circuit structure elements.

Step 816 includes forming a third conductive region in the third layer. The third conductive region has a fifth width and extends along the first direction. The fourth width is greater than the fifth width. For example, the semiconductor manufacturing equipment forms one or more M0 regions corresponding to the Normal M0 position above the First Wide M0 in FIG. 1C. The M0 regions corresponding to the Normal M0 position are conductive regions and have a width of $W_{M0}$. The M0 region extends along the X-axis direction. In an exemplary embodiment, the width of the M0 region is 10 nm, i.e., $W_{M0}$=10 nm. In an exemplary embodiment, the width of wide M0 region 117 (i.e., 11 nm) is greater than the width of the M0 region (i.e., 10 nm).

In some embodiments, step 816 also includes forming one or more M0 regions along with the Normal M0 position below the First Wide M0 in FIG. 1C. In some embodiments, the semiconductor manufacturing equipment performs steps 816 and 818 concurrently to form M0 regions and Wide M0 regions in the M0 layer of the integrated circuit.

In some embodiments, the isolating region in step 808 is a first isolating region. Method 800 also includes forming a second isolating region. The first and second isolating regions are on opposite sides of the first active region formed in step 802. A distance between the first and second isolating regions is equal to or greater than a threshold distance. For example, according to the CMD pattern the semiconductor manufacturing equipment forms both CMD regions 114 and 118 (FIG. 2D) and other CMD regions in the MD layer of three-metal-routing flip-flop circuit 200A (FIG. 2A). As a result, CMD region 118 is an isolating region between MD regions 122 and 126 (FIG. 2D), wherein MD regions 122 and 126 are also formed by the etching process according to the MD pattern in step 810. CMD regions 114 and 118 are on opposite sides of active region 111*b*-1 (FIG. 4A). A distance between CMD regions 114 and 118 is equal to or greater than $PITCH_{CMD}$ (FIG. 2D).

In some embodiments, the semiconductor manufacturing equipment forms all CMD regions of the integrated circuit by a single-patterning and single-etching (1P1E) process. Any two CMD regions are away from each other equal to or greater than $PITCH_{CMD}$ (FIG. 2D).

In some embodiments, the semiconductor manufacturing equipment is further configured to perform method 800 to fabricate integrated circuits 100A (FIG. 1A), 100B (FIG. 1B), 100C (FIG. 1C), 200A (FIG. 2A), 200B (FIG. 2B), 200D (FIG. 2D), 200E (FIG. 2E), 200F (FIG. 2F), 300A (FIG. 3), 400A (FIG. 4A), 400B (FIG. 4B), 400C (FIG. 4C), 500A (FIG. 5A), 500B (FIG. 5B), 500C (FIG. 5C), and/or other regions and structures in FIG. 2C, as described herein.

In some embodiments, the semiconductor manufacturing equipment is also configured to perform additional fabrication steps to fabricate the integrated circuits herein. In some embodiments, the semiconductor manufacturing equipment may perform another order of the steps of method 800 to fabricate the integrated circuits herein.

As explained above, this disclosure relates to a semiconductor device including a smaller active region (i.e., an AR-jog region) than a conventional one. The smaller active region requires a smaller area and therefore helps to reduce the area of the semiconductor device. Alternatively, the smaller area of the active region enables an increase in the gate density of the semiconductor device. Moreover, the semiconductor device also includes a wider middle M0 region for a VD between the M0 region and an MD region. Therefore, a circuit including the MD region can be routed and connected to other circuits through the M0 region. In some embodiments, the semiconductor device also includes a CMD region isolating two MD regions. The CMD region provides a space between MD and active regions and therefore helps to avoid time-dependent dielectric breakdown (TDDB) in the semiconductor device. Because of the space between MD and active regions, MD-EPI leakage may also be avoided or at least mitigated in the semiconductor device. Accordingly, the small active region (or the AR-jog structure) together with the CMD region reduces circuit areas and release process window.

This disclosure also relates to a three-metal-routing flip-flop circuit. The flip-flop circuit includes a small active region (i.e., an AR-jog structure) on its non-critical path. This helps to reduce a circuit area of the flip-flop circuit. This disclosure also relates to a circuit cell. The circuit cell includes a small active region (i.e., an AR structure). This helps to reduce a circuit area of the circuit cell. It also helps to reduce areas of any integrated circuits implemented by the circuit cell or similar circuit cells adopting the AR-jog structure. It also helps to integrate more gates on a device.

This disclosure also relates to a method performed by a computer to determine whether a circuit cell can utilize the small active region (or the AR-jog structure). The method helps to check whether a circuit cell can utilize the small active region (or the AR-jog structure). The method may help to generate a plurality of new circuit cells utilizing the small active region. These circuit cells can be used as alternative circuit cells for implementing application-specific integrated circuits with small areas.

One aspect of this disclosure relates to a semiconductor device. The semiconductor device includes first, second, and third conductive regions and first and second active regions. The first conductive region has a first width and extends along a first direction. The second conductive region has a second width and extends along the first direction. The first width is greater than the second width. The first active region has a third width and extends along the first direction. The second active region has a fourth width and extends along the first direction. The third width is less than the fourth width. The third conductive region extends along a second direction and is electrically connected to the first conductive region. The second direction is different from the first direction. The first and second active regions are neighboring active regions.

Another aspect of this disclosure relates to a three-metal-routing flip-flop circuit. The flip-flop circuit includes a first conductive region having a first width and extending along a first direction. The flip flop circuit also includes a second conductive region having a second width and extending along the first direction. The first width is greater than the second width. The flip-flop circuit also includes an active region having a third width and a fourth width and extending along the first direction. The third width is less than the fourth width. In addition, the flip-flop circuit includes a third conductive region extending along a second direction and being electrically connected to the first conductive region. The second direction is different from the first direction. The active region of the third width (i.e., a small width) also helps to reduce a circuit area of the flip-flop circuit.

Still another aspect of this disclosure relates to a method performed by a computer for determining a width of an active region in a circuit cell stored in a memory. The method includes obtaining, from the memory circuit, a first width for a first conductive region in the circuit cell, a first width for the active region, a differential width for the active region, and a space between the active region and a second conductive region in the circuit cell. The method also includes calculating a first parameter based on the first width for the first conductive region. The method also includes calculating a second parameter based on the first width for the active region and the space between the active region and a second conductive region. The method also includes determining whether the first parameter is less than the second parameter. In addition, the method includes calculating a third parameter based on a second width for the first conductive region and a fourth parameter based on the differential width for the active region in response to a determination that the first parameter is less than the second parameter, the second width for the first conductive region greater than the first width for the first conductive region. The method also includes determining whether the third parameter is equal to or greater than the fourth parameter. The method also includes determining the second width for the first conductive region as a width of the first conductive region in response to a determination that the third parameter is equal to or greater than the fourth parameter. The method also includes determining that a width of the active region equals the first width for the active region minus the differential width for the active region. In some embodiments, the method also includes inserting an isolating region between the second conductive region and a third conductive region.

Still another aspect of this disclosure relates to a method for fabricating an integrated circuit. The method includes forming a first active region in a first layer. The first active region has a first width and extends along a first direction. The method also includes forming a second active region in the first layer. The second active region has a second width and extends along the first direction. The first width is less than the second width. The first and second active regions are neighboring active regions. The second layer is above the first layer. The method also includes forming a first conductive region in the second layer. The first conductive region extends along a second direction. The second direction is different from the first direction. The method also includes fabricating a via coupled to the first conductive region and above the second layer. The via has a third width. The method also includes forming a second conductive region in a third layer and coupled to the via. The third layer is above the second layer. The via is coupled between the first conductive region in the second layer and the second conductive region in the third layer. The second conductive region has a fourth width and extends along the first direction. The third width is equal to or less than the fourth width. The method also includes forming a third conductive region in the third layer. The third conductive region has a fifth width and extends along the first direction. The fourth width is greater than the fifth width.

Specific examples of metal lines, layers, and component dimensions have been provided. However, these examples are not intended to be limiting. Persons of ordinary skill will now understand that the embodiments herein can be practiced with equal effectiveness with components having other metal lines, layers, and dimensions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make a plurality of changes, substitutions, and alterations herein without departing from the spirit and scope of the present disclosure.

What is claimed is:

1. A semiconductor device, comprising:
a first conductive region having a first width and extending along a first direction;
a second conductive region having a second width and extending along the first direction, the first width greater than the second width;
a first active region having a third width and extending along the first direction;
a second active region having a fourth width and extending along the first direction, the third width less than the fourth width; and
a third conductive region extending along a second direction and electrically connected to the first conductive region through a via, the second direction different from the first direction,
wherein the first and second active regions are neighboring active regions.

2. The semiconductor device of claim 1, wherein:
the first conductive region is in a first layer;
the third conductive region is in a second layer; and
the second direction is perpendicular to the first direction.

3. The semiconductor device of claim 2,
wherein the via is coupled between the first conductive
region and the third conductive region, the via having
a fifth width equal to or less than the first width.

4. The semiconductor device of claim 1, further compris-
ing:
a third active region having the fourth width, extending
along the first direction, and coupled to the first active
region.

5. The semiconductor device of claim 1, wherein a space
between the third conductive region and the first active
region is equal to or greater than a threshold of space.

6. The semiconductor device of claim 1, further compris-
ing:
a fourth conductive region having the second width and
extending along the first direction;
wherein:
the first, second, and fourth conductive regions are in a
first layer; and
the third conductive region is in a second layer and
extends along the second direction perpendicular to
the first direction.

7. The semiconductor device of claim 1, further compris-
ing:
a fourth conductive region extending along the second
direction; and
an isolating region extending along the second direction
and formed between the third and fourth conductive
regions.

8. The semiconductor device of claim 7, wherein:
the first and second active regions are in a first layer;
the third and fourth conductive regions and the isolating
region are in a second layer, the second layer different
from the first layer;
the third conductive region extends in the second layer
and above the second active region in the first layer;
and
the fourth conductive region extends in the second layer
and above the first active region in the first layer.

9. The semiconductor device of claim 7, wherein the
isolating region is a first isolating region, the semiconductor
device further comprising:
a second isolating region extending along the second
direction,
wherein:
the first and second isolating regions are on opposite
sides of the first active region; and
a distance between the first and second isolating
regions is equal to or greater than a threshold dis-
tance.

10. The semiconductor device of claim 1, wherein:
the via is a first via coupled between the first conductive
region and the third conductive region; and
the semiconductor device further comprises a second via
coupled to a source of a transistor,
wherein the first and second vias are on opposite sides of
the first active region.

11. The semiconductor device of claim 1, further com-
prising:
a fourth conductive region having the first width and
extending along the first direction;
a fifth conductive region having the second width and
extending along the first direction;
a third active region having the third width and extending
along the first direction;
a fourth active region having fourth width and extend-
ing along the first direction; and a sixth conductive region extending along the second
direction and electrically connected to the fourth con-
ductive region,
wherein the third and fourth active regions are neighbor-
ing active regions.

12. The semiconductor device of claim 11, wherein:
the third and sixth conductive regions are on opposite
sides of the first active region; and
the third and sixth conductive regions are on opposite
sides of the third active region.

13. The semiconductor device of claim 11, wherein:
the via is a first via coupled between the first conductive
region and the third conductive region; and
the semiconductor device further comprises:
a second via coupled between the fourth conductive
region and the sixth conductive region; and
a third via coupled to a source of a transistor;
wherein the second and third vias are on opposite sides
of the third active region.

14. The semiconductor device of claim 13, wherein the
transistor is a first transistor, the semiconductor device
further comprising:
a fourth via coupled to a source of a second transistor,
wherein the first and fourth vias are on opposite sides of
the first active region.

15. A flip-flop circuit, comprising:
a first conductive region having a first width and extend-
ing along a first direction;
a second conductive region having a second width and
extending along the first direction, the first width
greater than the second width;
an active region having a third width and a fourth width,
and extending along the first direction, the third width
less than the fourth width; and
a third conductive region extending along a second direc-
tion and electrically connected to the first conductive
region, the second direction different from the first
direction.

16. The flip-flop circuit of claim 15, wherein:
the first, second, and third conductive regions and the
active region are a first plurality of circuits; and
the flip-flop circuit further comprises a second plurality of
circuits comprising a longest circuit path of the flip-flop
circuit.

17. The flip-flop circuit of claim 15, further comprising:
a multiplexer comprising a data input circuit and a scan
input circuit,
wherein the scan input circuit comprises at least a part of
the active region.

18. A semiconductor device, comprising a plurality of
circuit cells, wherein at least one of the plurality of circuit
cells includes:
a first active region having a first width and extending
along a first direction in a first layer;
a second active region having the first width and a second
width and extending along the first direction in the first
layer, wherein the second width is less than the first
width, and the first and second active regions are
neighboring active regions;
a first conductive region having a third width and extend-
ing along the first direction in a second layer, the
second layer being above the first layer;
a second conductive region having a fourth width and
extending along the first direction in the second layer,
the third width being greater than the fourth width; and
a third conductive region extending along a second direc-
tion in a third layer and electrically connected to the first conductive region through a via, the second direction being different from the first direction, the third layer being between the first and second layers.

19. The semiconductor device of claim 18, wherein the at least one of the plurality of circuit cells further includes:

third and fourth active regions having the first width and extending along the first direction in the first layer.

20. The semiconductor device of claim 18, wherein the third conductive region extends along the second direction, above and across the first active region, and toward a portion of the second active region in a plan view, the portion of the second active region having the second width.

* * * * *